US011265493B2

(12) United States Patent
Wada

(10) Patent No.: US 11,265,493 B2
(45) Date of Patent: *Mar. 1, 2022

(54) IMAGING SENSOR, IMAGING SYSTEM, AND MOVING BODY

(71) Applicant: CANON KABUSHIKI KAISHA, Tokyo (JP)

(72) Inventor: Yoichi Wada, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/893,259

(22) Filed: Jun. 4, 2020

(65) Prior Publication Data

US 2020/0304740 A1 Sep. 24, 2020

Related U.S. Application Data

(63) Continuation of application No. 16/008,984, filed on Jun. 14, 2018, now Pat. No. 10,708,530.

(30) Foreign Application Priority Data

Jun. 29, 2017 (JP) .................. 2017-127979

(51) Int. Cl.
*H04N 5/369* (2011.01)
*H04N 17/00* (2006.01)
(Continued)

(52) U.S. Cl.
CPC ............ *H04N 5/3698* (2013.01); *G06T 7/55* (2017.01); *H01L 27/14603* (2013.01); *H01L 27/14636* (2013.01); *H01L 27/14643* (2013.01); *H04N 5/3655* (2013.01); *H04N 5/3675* (2013.01); *H04N 17/002* (2013.01);
(Continued)

(58) Field of Classification Search
CPC .. H04N 5/3698; H04N 5/3655; H04N 5/3675; H04N 17/002; G06T 7/55; G06T 2207/30261; H01L 27/14643; H01L 27/14603; H01L 27/14636;
(Continued)

(56) References Cited

U.S. PATENT DOCUMENTS 10,708,530 B2 *  7/2020  Wada ................ H04N 5/3698
2013/0194471 A1 *  8/2013  Yamashita ......... H04N 5/37457
348/308

(Continued)

FOREIGN PATENT DOCUMENTS

JP  07-202159 A  8/1995
JP  2002-009269 A  1/2002
(Continued)

*Primary Examiner* — Gevell V Selby
(74) *Attorney, Agent, or Firm* — Canon U.S.A., Inc. IP Division

(57) ABSTRACT

A third line that supplies a first potential to a first semiconductor region of a first detection pixel and a fourth line that supplies a second potential to the first semiconductor region of a second detection pixel are provided. An interval between a partial line of the third line and a partial line of the fourth line is longer than an interval between a partial line of a first line and a partial line of a second line which extend along the partial line of the third line and the partial line of the fourth line.

48 Claims, 12 Drawing Sheets

(51) Int. Cl.
  *G06T 7/55* (2017.01)
  *H01L 27/146* (2006.01)
  *H04N 5/365* (2011.01)
  *H04N 5/367* (2011.01)
  *B60W 30/09* (2012.01)

(52) U.S. Cl.
  CPC ......... *B60W 30/09* (2013.01); *B60W 2520/10* (2013.01); *B60W 2520/14* (2013.01); *B60W 2554/00* (2020.02); *B60W 2710/20* (2013.01); *G06T 2207/30261* (2013.01)

(58) Field of Classification Search
  CPC ......... B60W 2554/00; B60W 2710/20; B60W 30/09; B60W 2520/10; B60W 2520/14
  See application file for complete search history.

(56) References Cited

U.S. PATENT DOCUMENTS

| 2014/0347537 | A1* | 11/2014 | Hamada | ............... | H04N 5/3745 |
|---|---|---|---|---|---|
| | | | | | 348/308 |
| 2018/0098012 | A1* | 4/2018 | Takado | ............... | H04N 5/3696 |

FOREIGN PATENT DOCUMENTS

| JP | 2009-118427 A | 5/2009 |
|---|---|---|
| WO | 2006/120815 A1 | 11/2006 |

\* cited by examiner

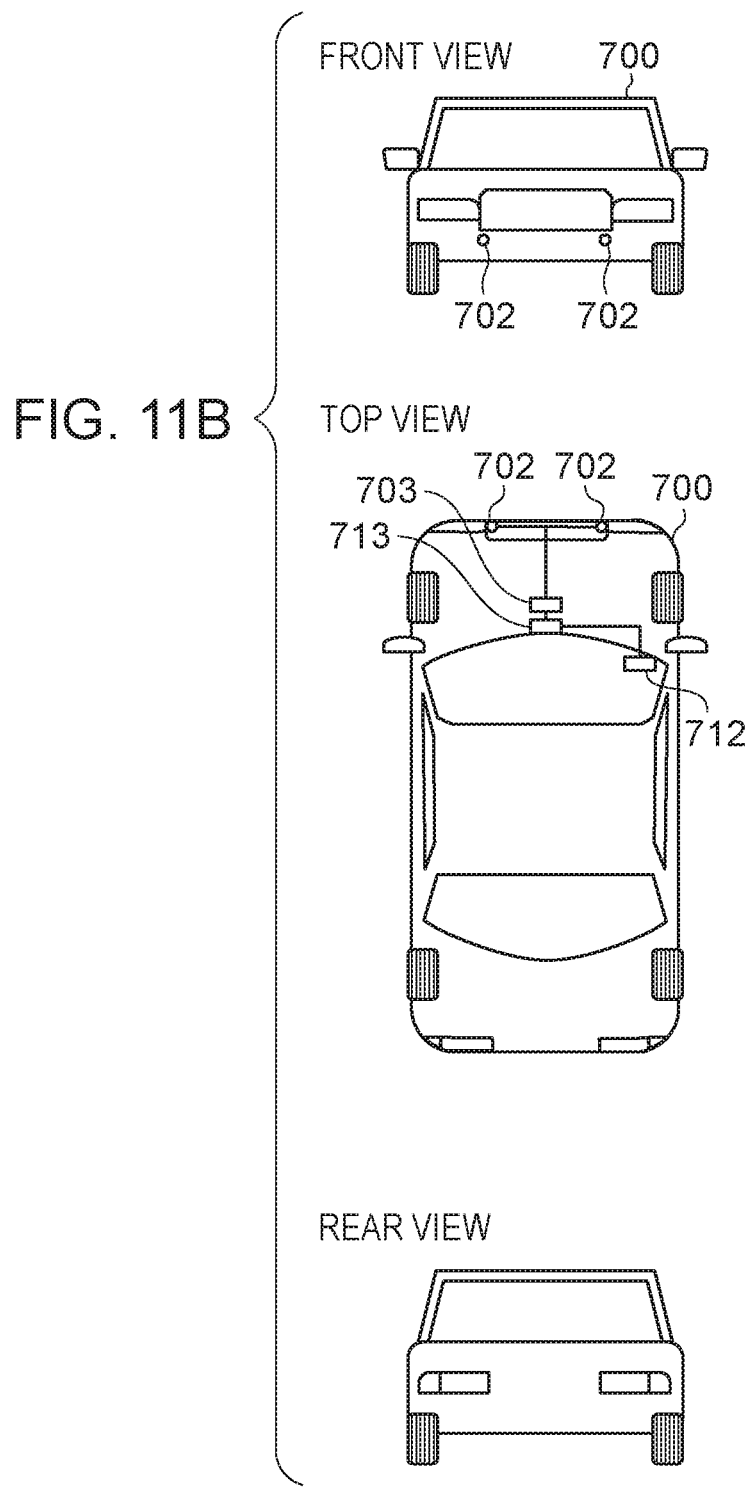

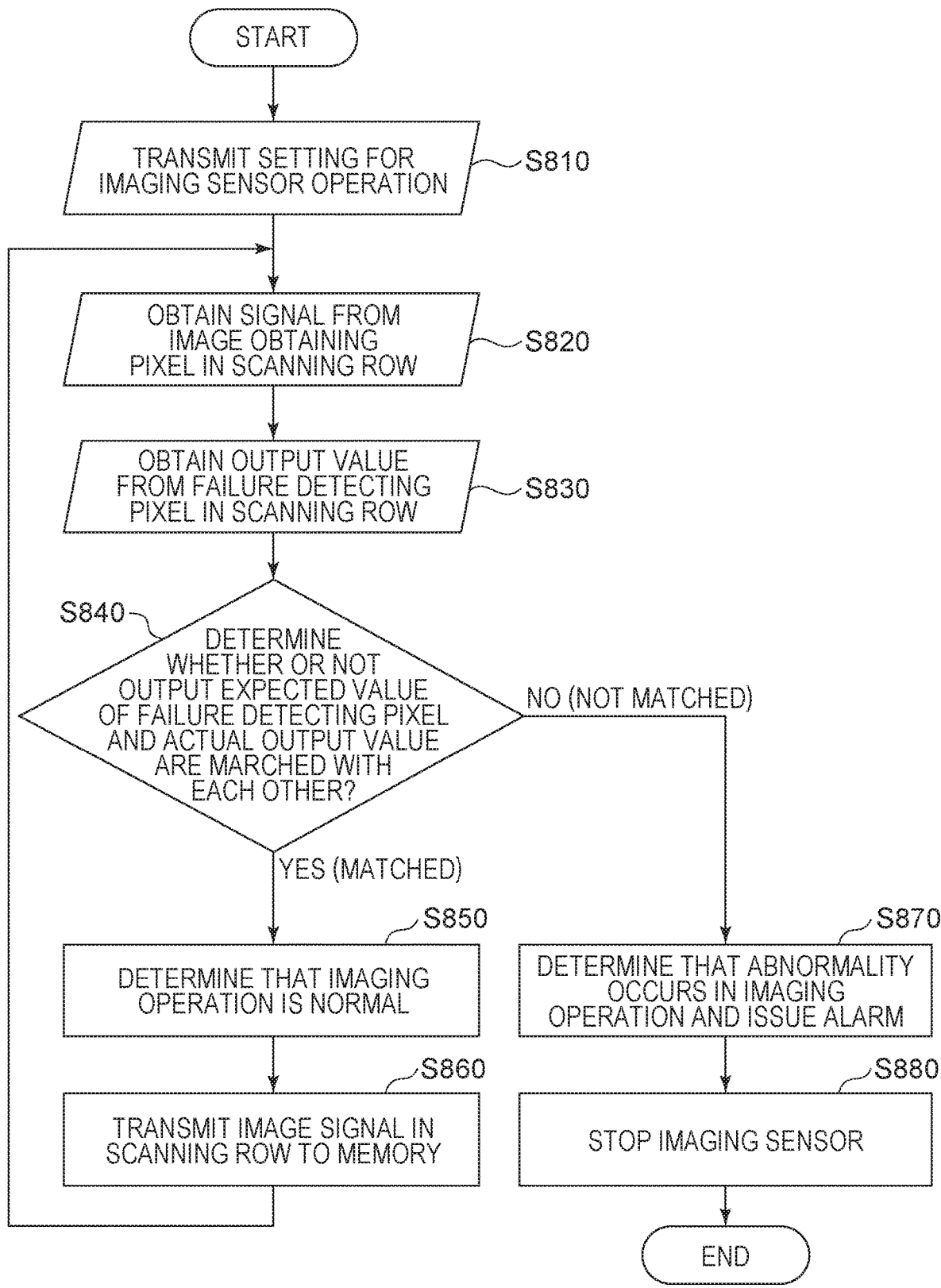

IMAGING SENSOR, IMAGING SYSTEM, AND MOVING BODY

CROSS-REFERENCE TO RELATED APPLICATION

This application is a Continuation of U.S. application Ser. No. 16/008,984, filed Jun. 14, 2018, which claims priority from Japanese Patent Application No. 2017-127979 filed Jun. 29, 2017, which are hereby incorporated by reference herein in their entireties.

BACKGROUND OF THE INVENTION

Field of the Invention

The aspect of the embodiments relates to an imaging sensor, an imaging system, and a moving body.

Description of the Related Art

In recent years, improvement in a reliability has been demanded following miniaturization of a solid-state imaging sensor. In particular, for a use on a vehicle or the like, safety measures are particularly important due to a harsh use environment, and an imaging system provided with a failure detection function has been demanded as a function safety response. Accordingly, it is being discussed that a failure detecting mechanism is also incorporated in the imaging sensor.

An imaging sensor provided with a photoelectric conversion unit in each pixel and a unit that generates a reference signal and configured to output the reference signal is described as an imaging sensor including a failure detecting unit in International Publication No. 2006/120815. It is assumed that a level of the output reference signal is compared with an expected value, and it is possible to determine that the imaging sensor is failing in a case where a comparison result is out of an expected range.

A configuration including a first voltage supply line that supplies a first potential to a part of pixels among a plurality of failure detecting pixels and a second voltage supply line that supplies a second potential to the other part of the pixels is adopted in some cases. If the first voltage supply line and the second voltage supply line are short-circuited, an issue arises that a predetermined potential is not supplied to the plurality of plurality of failure detecting pixels.

SUMMARY OF THE INVENTION

An aspect of the embodiments provides an imaging sensor provided with a pixel array including a plurality of pixels arranged in a plurality of rows and a plurality of columns, the plurality of pixels including a first detection pixel, a second detection pixel, and an effective pixel. Each of the first detection pixel and the second detection pixel includes a first semiconductor region of a first conductivity type, a second semiconductor region of the first conductivity type, a transfer gate connected to the first semiconductor region and the second semiconductor region, and an amplification transistor connected to the second semiconductor region. The imaging sensor includes a first line and a second line connected to the effective pixel, a third line that supplies a first potential to the first semiconductor region of the first detection pixel, and a fourth line that supplies a second potential to the first semiconductor region of the second detection pixel. Each of the first line and the second line includes a partial line extending along a first direction in the pixel array, and the partial line of the first line and the partial line of the second line are adjacent to each other. Each of the third line and the fourth line includes a partial line extending along the first direction in the pixel array. An interval between the partial line of the third line and the partial line of the fourth line is longer than an interval between the partial line of the first line and the partial line of the second line in a plan view.

Further features of the disclosure will become apparent from the following description of exemplary embodiments with reference to the attached drawings.

BRIEF DESCRIPTION OF THE DRAWINGS

FIGS. 11A and 11B are overall views of a moving body.
FIG. 12 illustrates a control flow of the moving body.

DESCRIPTION OF THE EMBODIMENTS

First Exemplary Embodiment

Figure 1:
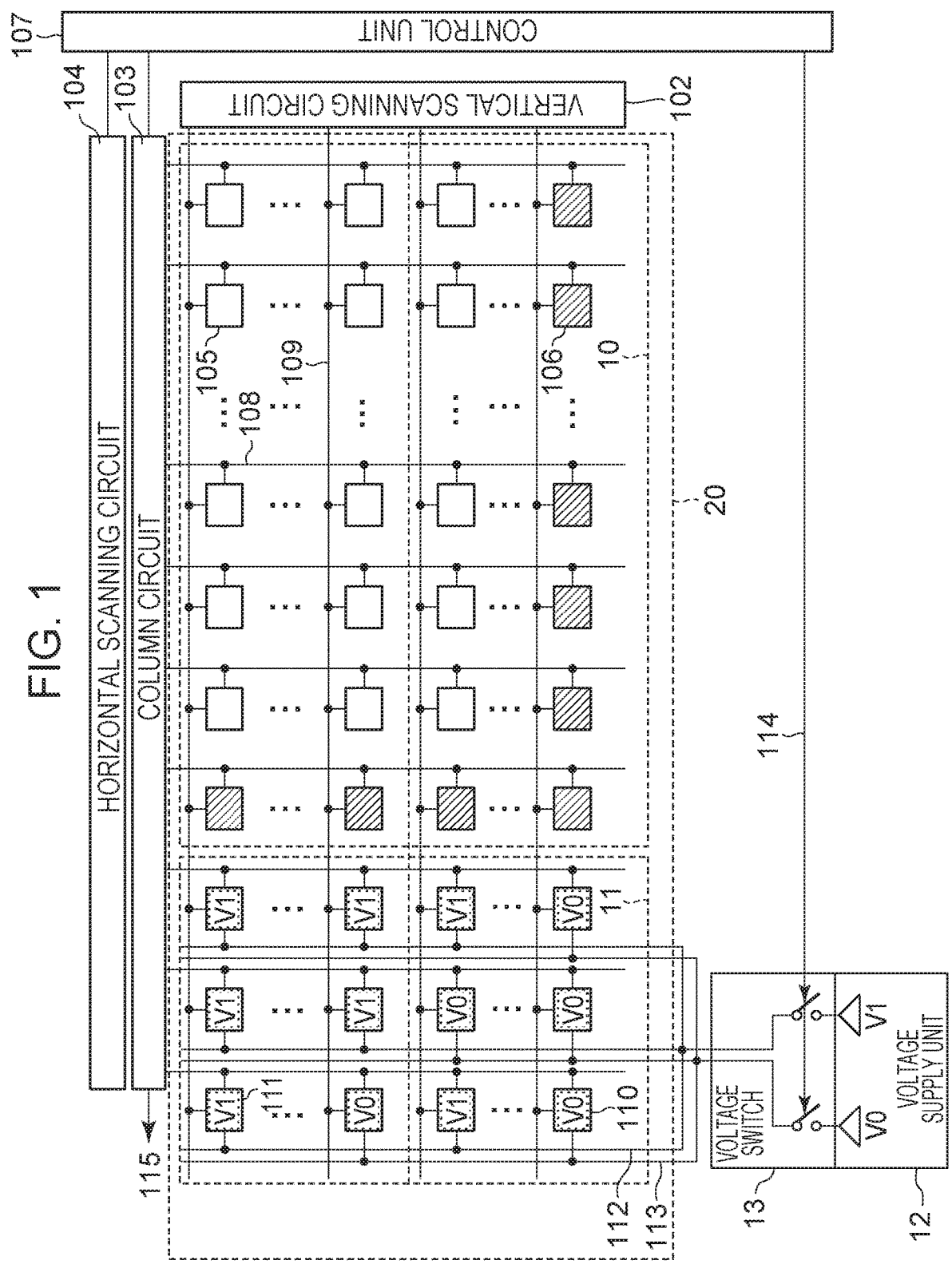
FIG. 1 is an overall view of an imaging sensor.
Figure 2:
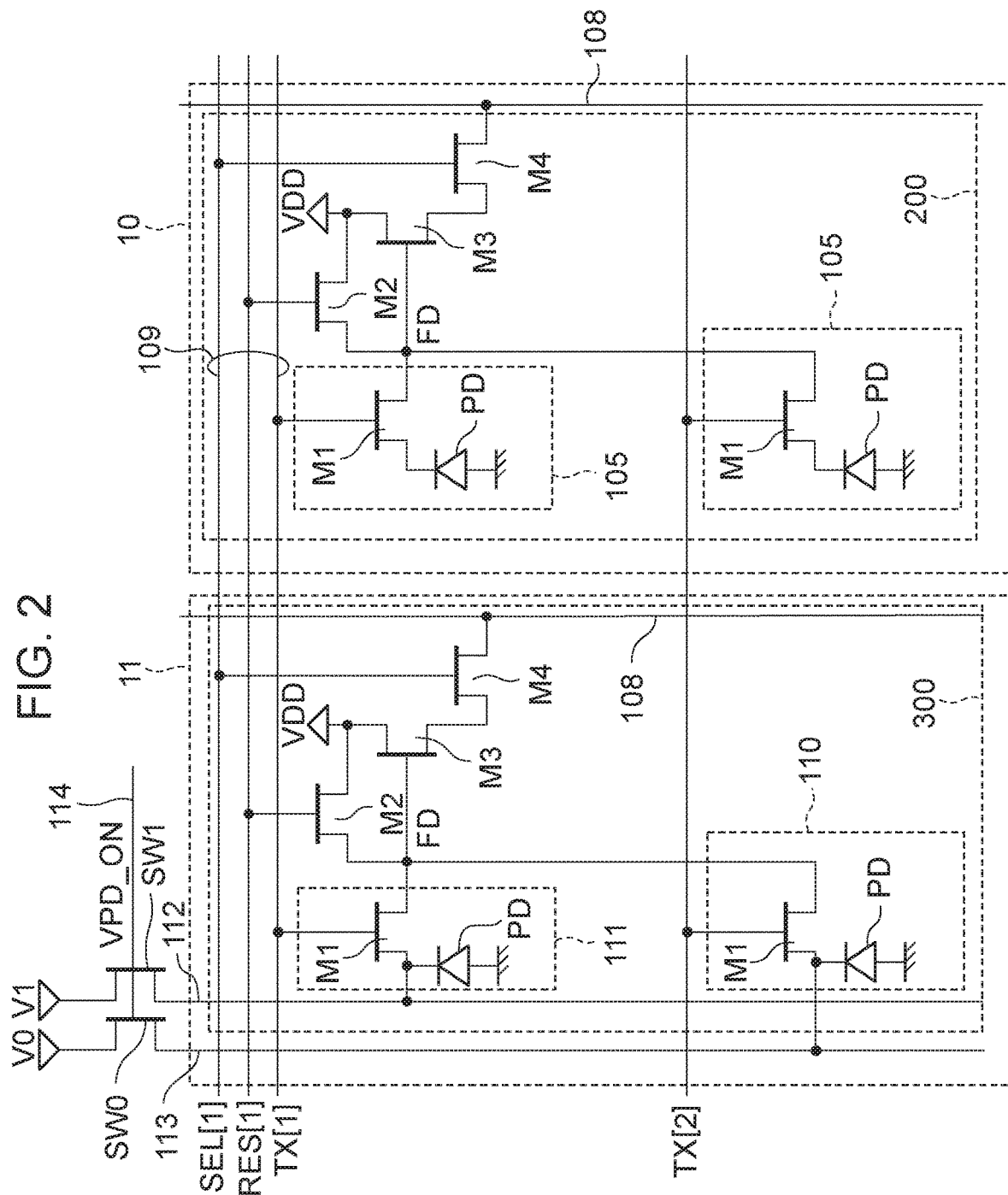
FIG. 2 is an equivalent circuit diagram of an image obtaining pixel and a failure detecting pixel.
Figure 3A:
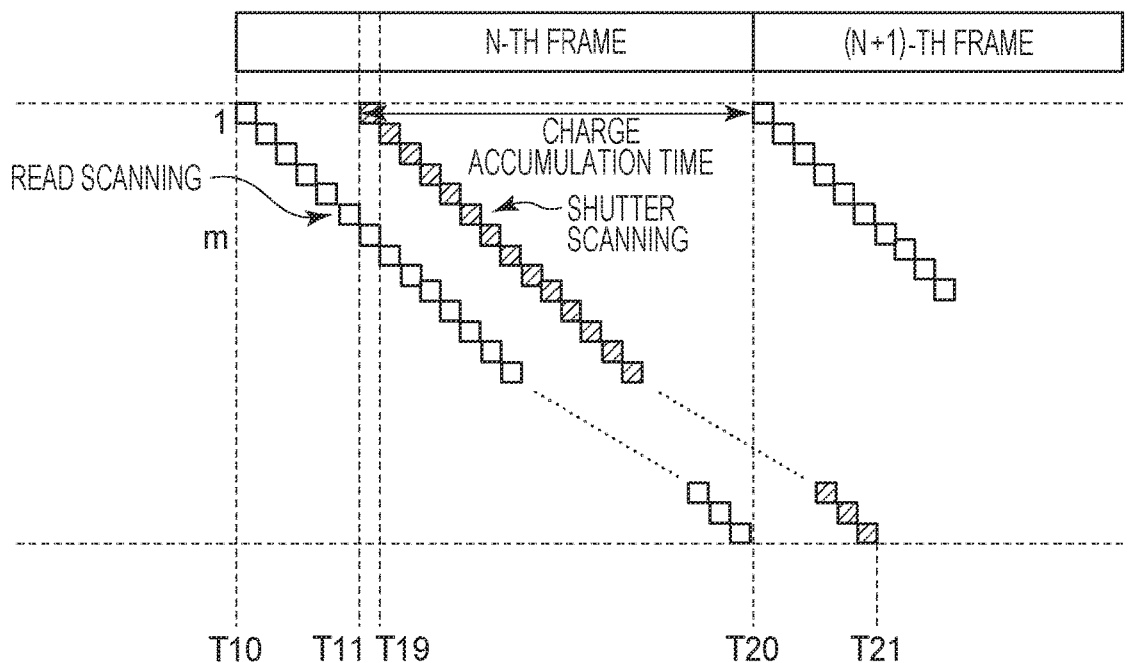
FIGS. 3A and 3B illustrate operations of pixels.
Figure 3B:
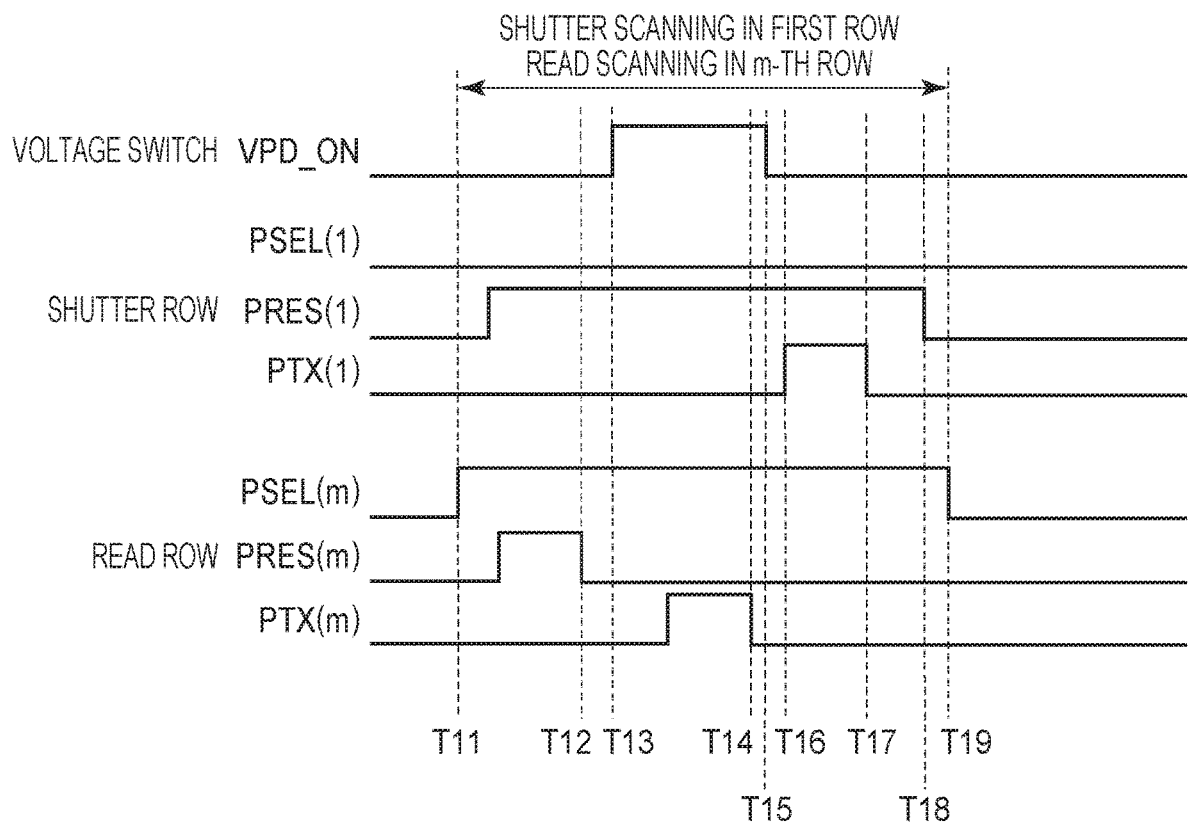

FIG. 1 is a block diagram illustrating a schematic configuration of an imaging sensor according to the present exemplary embodiment. FIG. 2 is a circuit diagram illustrating configuration examples of pixels in the imaging sensor according to the present exemplary embodiment. FIGS. 3A and 3B are timing charts illustrating a driving method for the imaging sensor according to the present exemplary embodiment.

First, a structure of the imaging sensor according to the present exemplary embodiment will be described with reference to FIG. 1 and FIG. 2.

As illustrated in FIG. 1, an imaging sensor 100 according to the present exemplary embodiment includes a first region 10, a second region 11, a vertical scanning circuit 102, a column circuit 103, a horizontal scanning circuit 104, an output circuit 115, a control unit 107, a voltage supply unit 12, and a voltage switch 13.

A pixel array 20 includes a plurality of pixels arranged in a plurality of rows and a plurality of columns. The pixel array 20 includes a first region 10 including a part of the plurality of pixels and a second region 11 including the other part of the plurality of pixels.

Pixels 105 in a first group and pixels 106 in a second group are arranged in a plurality of rows and a plurality of columns in the first region 10. The first region 10 is an image obtaining pixel region where image obtaining pixels (effective pixels) are arranged. The pixel 105 is a pixel provided with a photoelectric conversion unit and represented by an outline block in FIG. 1. The pixel 106 is a pixel provided with a photoelectric conversion unit that is shielded from light and represented by a shaded block in FIG. 1. The pixel 106 is a pixel configured to output a reference signal corresponding to a reference for a black level and is typically arranged in a peripheral portion of the first region 10. It should be noted that the pixels 106 does not necessarily need to be provided.

Pixels 110 in a third group and pixels 111 in a fourth group are arranged in a plurality of rows and a plurality of columns in the second region 11. The second region 11 is a failure detecting pixel region where failure detecting pixels are arranged. The pixel 110 is a pixel configured to output a signal in accordance with a potential of a fixed voltage terminal V0 and represented by a block denoted as "V0" in FIG. 1. The pixel 111 is a pixel configured to output a signal in accordance with a potential of a fixed voltage terminal V1 and represented by a block denoted as "V0" FIG. 1.

The first region 10 and the second region 11 are arranged so as to be adjacent to each other in a row direction (transverse direction in FIG. 1), and rows where the first region 10 and the second region 11 are arranged are the same but columns are different from each other.

A pixel control line 109 extending in a row direction is arranged in each row of the first region 10 and the second region 11. The pixel control line 109 in each row serves as a signal line common to the pixels 105, 106, 110, and 111 belonging to the corresponding row. The pixel control line 109 is connected to the vertical scanning circuit 102.

A vertical output line 108 extending in a column direction is arranged in each column of the first region 10 and the second region 11. The vertical output line 108 in each column in the first region 10 serves as a signal line common to the pixels 105 and 106 belonging to the corresponding column. The vertical output line 108 in each column in the second region 11 serves as a signal line common to the pixels 110 and 111 belonging to the corresponding column. The vertical output line 108 is connected to the column circuit 103.

The vertical scanning circuit 102 supplies a predetermined control signal for driving the pixels 105, 106, 110, and 111 via the pixel control line 109. A logic circuit such as a shift register or an address decoder may be used as the vertical scanning circuit 102. In FIG. 1, the pixel control line 109 in each row is represented by a single signal line but includes a plurality of control signal lines in actuality. The pixels 105, 106, 110, and 111 in the row selected by the vertical scanning circuit 102 operate so as to output the signals to the respectively corresponding vertical output lines 108 at the same time.

The column circuit 103 amplifies a pixel signal output to the vertical output line 108 and performs correlation double sampling processing based on a signal at the time of resetting and a signal at the time of photoelectric conversion. Correlation double sampling processing based on the signal at the time of the resetting and a signal at the time of fixed voltage input is performed with respect to the pixel signals output from the failure detecting pixels 110 and 111 similarly as in the image obtaining pixels 105 and 106.

The horizontal scanning circuit 104 supplies, to the column circuit 103, a control signal for sequentially transferring the pixel signal processed in the column circuit 103 for each column to the output circuit 115.

The output circuit 115 is constituted by a buffer amplifier, a differential amplifier, or the like and outputs the pixel signal transferred from the column circuit 103 to a signal processing unit (not illustrated) arranged outside the imaging sensor 100. It should be noted that the column circuit 103 or the output circuit 115 may be provided in an analog-to-digital (AD) conversion unit, and a digital image signal may be output to the outside.

The voltage supply unit 12 is a power source circuit that supplies potentials of the predetermined fixed voltage terminals V0 and V1. The voltage switch 13 includes switches SW0 and SW1. The switch SW0 is provided between the fixed voltage terminal V0 of the voltage supply unit 12 and a voltage supply line 112 and supplies the potential of the fixed voltage terminal V0 to the voltage supply line 112 in accordance with a control signal (VPD_ON) supplied from the control unit 107 via a control signal line 114. The switch SW1 is provided between the fixed voltage terminal V1 of the voltage supply unit 12 and the voltage supply line 113 and supplies the potential of the fixed voltage terminal V1 to the voltage supply line 113 in accordance with the control signal (VPD_ON) from the control unit 107 via the control signal line 114.

The voltage supply lines 112 and 113 are lines for supplying the potentials of the fixed voltage terminals V0 and V1 from the voltage supply unit 12 to the pixels 110 and 111 arranged in the second region 11. In the plurality of pixels 110 and 111 in the second region 11, for example, it is possible to reduce the size of the circuit by setting the voltage supply lines 112 and 113 to be commonly used as illustrated in the drawing.

The pixels 110 to which the potential of the fixed voltage terminal V0 is supplied and the pixels 111 to which the potential of the fixed voltage terminal V1 different from the potential of the fixed voltage terminal V0 is supplied are arranged in a matrix form following a specific pattern in the second region 11.

A case where the second region 11 is constituted by three columns will be described as an example. The pixels 110, 110, and 110 are arranged in each column in a certain row (for example, the bottom row in FIG. 1), for example. The pixels 111, 110, and 111 are arranged in each column in another row (for example, the second row from the bottom in FIG. 1). That is, a pattern of fixed voltages applied to the pixels 110 and 111 varies depending on the row of the vertical scanning.

The failure detecting pixel 110 and the image obtaining pixel 105 belonging to the same row share the pixel control line 109. Therefore, when the patter of the output in the second region 11 is collated with an expected value, it is possible to detect whether the vertical scanning circuit 102 normally operates or fails and scans an unintended row.

It should be noted that the case where the second region 11 is constituted by the three columns has been exemplified according to the present exemplary embodiment, but the number of columns constituting the second region 11 is not limited to three.

FIG. 2 is a circuit diagram illustrating a configuration example of the pixels 105, 106, 110, and 111 constituting the first region 10 and the second region 11. FIG. 2 illustrates extractions the pixel 105 arranged in the first row and the pixel 106 arranged in the second row from the first column in the first region 10 and the pixel 111 arranged in the first row and the pixel 110 arranged in the m-th row from the first column in the second region 11.

Each of the pixels 105 arranged in the first region 10 includes a photoelectric conversion unit PD and a transfer transistor M1. A pixel cell 200 includes the two pixels 105. The pixel cell 200 includes a reset transistor M2, an amplification transistor M3, and a selection transistor M4. The photoelectric conversion unit PD is a photodiode, for example. An anode of the photodiode of the photoelectric conversion unit PD is connected to a reference voltage terminal GND, and a cathode of the photodiode is connected to a source of the transfer transistor M1. A drain of the transfer transistor M1 is connected to a source of the reset transistor M2 and a gate of the amplification transistor M3. A connection node of the drain of the transfer transistor M1, the source of the reset transistor M2, and a gate of an amplification transistor M5 constitutes a floating diffusion FD. A drain of the reset transistor M2 and a drain of the amplification transistor M3 are connected to a power source voltage terminal VDD. A source of the amplification transistor M3 is connected to a drain of the selection transistor M4. A source of the selection transistor M4 is connected to the vertical output line 108. The pixel 105 in the first row and the pixel 105 in the second row share the floating diffusion FD corresponding to an input node of the gate of the single amplification transistor M3.

The pixel 110 and the pixel 111 arranged in the second region 11 include a photodiode PD that is shielded from light and the transfer transistor M1. A pixel cell 300 includes the pixel 110 and the pixel 111. The pixel cell 300 further includes the reset transistor M2, the amplification transistor M3, and the selection transistor M4. The source of the transfer transistor M1 of the pixel 111 (one of the source and the drain of the transfer transistor M1) is connected to the voltage supply line 112. Hereinafter, the pixel 111 will be described. The drain of the transfer transistor M1 (the other one of the source and the drain of the transfer transistor M1) is connected to the source of the reset transistor M2 and the gate of the amplification transistor M3. A connection node of the drain of the transfer transistor M1, the source of the reset transistor M2, and the gate of the amplification transistor M5 constitutes the floating diffusion FD. The drain of the reset transistor M2 and the drain of the amplification transistor M3 are connected to the power source voltage terminal VDD. The source of the amplification transistor M3 is connected to the drain of the selection transistor M4. The source of the selection transistor M4 is connected to the vertical output line 108. The pixel 111 in the first row and the pixel 110 in the second row share the floating diffusion FD corresponding to the input node of the gate of the single amplification transistor M3.

The source of the transfer transistor M1 of the pixel 110 arranged in the second region 11 is connected to the voltage supply line 113 instead of the voltage supply line 112.

In the case of the pixel configuration illustrated in FIG. 2, the pixel control line 109 arranged in each row includes signal lines TX, RES, and SEL. Each of the signal lines TX is connected to a gate of the transfer transistor M1 of the pixel belonging to the corresponding row. Each of the signal lines RES is connected to a gate of the reset transistor M2 of the pixel belonging to the corresponding row. Each of the signal lines SEL is connected to a gate of the selection transistor M4 of the pixel belonging to the corresponding row. It should be noted that row numbers are added to the reference signs of the signal lines in FIG. 2 (for example, SEL(1), RES(1)).

A control signal PTX corresponding to a drive pulse for controlling the transfer transistor M1 is output from the vertical scanning circuit 102 to the signal line TX. A control signal PRES corresponding to a drive pulse for controlling the reset transistor M2 is output from the vertical scanning circuit 102 to the signal line RES. A control signal PSEL corresponding to a drive pulse for controlling the selection transistor M4 is output from the vertical scanning circuit 102 to the signal line SEL. In a case where each of the transistors is constituted by an N-type transistor, the corresponding transistor turns on when a control signal at a high level is supplied from the vertical scanning circuit 102, and the corresponding transistor turns off when a control signal at a low level is supplied from the vertical scanning circuit 102.

The photoelectric conversion unit PD included in the image obtaining pixel 105 converts incident light into the amount of charges in accordance with the light amount (photoelectric conversion) and also accumulates the generated charges. When the transfer transistor M1 of the pixel 105 turns on, the charges of the photoelectric conversion unit PD are transferred to the floating diffusion FD. The floating diffusion FD has a voltage in accordance with the amount of charges transferred from the photoelectric conversion unit PD by charge voltage conversion based on its capacitance. When the transfer transistors M1 of the pixels 110 and 111 turn on, voltages supplied from the voltage supply lines 112 and 113 are applied to the floating diffusion FD. A configuration is adopted in which the power source voltage is supplied to the drain of the amplification transistor M3, and a bias current is supplied from a current source which is not illustrated in the drawing via the selection transistor M4 to the source of the amplification transistor M3, and an amplification unit (source follower circuit) is constituted by using the gate of the amplification transistor M3 as an input node. With this configuration, the amplification transistor M3 outputs a signal based on a voltage of the floating diffusion FD to the vertical output line 108 via the selection transistor M4. When the reset transistor M2 turns on, the floating diffusion FD is reset to a voltage in accordance with the power source voltage VDD.

With regard to the pixels in the same row, the common control signals PTX, PRES, and PSEL are supplied from the vertical scanning circuit 102 to the first region 10 and the second region 11. For example, the control signals PTX(m), PSEL(m), and PRES(m) are respectively supplied to the transfer transistors M1, the reset transistors M2, and the selection transistors M4 of the pixels 105, 106, 110, and 111 in the m-th row.

Next, a driving method for the imaging sensor according to the present exemplary embodiment will be described with reference to FIGS. 3A and 3B. FIG. 3A is a timing chart illustrating a relationship between read scanning and shutter scanning during one frame period. FIG. 3B is a timing chart illustrating a detail of operations of the pixels in the scanning in a read scanning row and a shutter scanning row.

FIG. 3A illustrates an outline of operations in the N-th frame which starts at a time T10 and ends at a time T20 and in the (N+1)-th frame which starts from the time T20. The operation in each of the frames includes read scanning where read operation from the pixels 105, 106, 110, and 111 is sequentially performed in units of row and shutter scanning where charge accumulation to the photoelectric conversion units PD of the pixels 105 and 106 is sequentially started in units of row.

The read scanning in the N-th frame starts at the time T10 and ends at the time T20. The time T10 is a starting time of the read operation from the pixel in the first row, and the time T20 is an ending time of the read operation from the pixel in the last row.

The shutter scanning in the N-th frame starts at a time T11 and ends at a time T21. The time T11 is a starting time of shutter operation in the pixel in the first row, and the time T21 is an ending time of the shutter operation in the pixel in the last row. A period from the starting time of the shutter operation until the starting time of the next read operation corresponds to a charge accumulation time. For example, when attention is paid to the first row, a period from the time T11 until the time T20 corresponds to the charge accumulation time. When a starting timing of the shutter operation is controlled, it is possible to control the charge accumulation time.

Herein, the read operation from the pixel in the m-th row starts at the time T11 when the shutter operation of the pixel in the first row starts. The shutter operation of the pixel in the first row and the read operation from the pixel 106 in the m-th row end at a time T19.

FIG. 3B illustrates a detail of the operations in the pixels from the time T11 until the time T19. It should be noted that the operations of the pixels in the shutter operation and the read operation are the same.

At the time T11, the control signal PSEL(m) in the read scanning row (the m-th row) turns to the high level, and the selection transistor M4 of the pixel in the read scanning row turns on. With this operation, a state is established in which the signal can be read out from the pixel in the read scanning row to the vertical output line 108.

Thereafter, during a period from the time T11 until a time T12, the control signal PRES(1) in the shutter scanning row (first row) and the control signal PRES(m) in the read scanning row turn to the high level. With this operation, the reset transistors M2 of the pixels in the shutter scanning row and the read scanning row turn on, and the floating diffusion FD is reset.

Thereafter, at the time T12, the control signal PRES(m) in the read scanning row turns to the low level, and the reset transistor M2 of the pixel in the read scanning row turns off. With this operation, the charges existing in the floating diffusion FD are discharged to the power source voltage terminal VDD, and the voltage of the floating diffusion FD is amplified by a source follower operation to be read out to the vertical output line 108.

Thereafter, when the control signal VPD_ON turns to the high level at a time T13, the switches SW0 and SW1 of the voltage switch 13 turn on, and the potentials of the fixed voltage terminals V0 and V1 are respectively supplied from the voltage supply unit 12 to the voltage supply lines 112 and 113.

Thereafter, during a period from the time T13 until a time T14, the control signal PTX(m) in the read scanning row turns to the high level, the transfer transistor M1 of the pixel in the read scanning row turns on. With this operation, the charges accumulated in the photoelectric conversion unit PD are transferred to the floating diffusion FD in the pixels 105 and 106 in the read scanning row. On the other hand, the potentials of the fixed voltage terminals V0 and V1 supplied from the voltage supply unit 12 are written into the floating diffusion FD in the pixels 110 and 111 in the read scanning row.

Thereafter, at the time T14, the control signal PTX(m) in the read scanning row turns to the low level, and the transfer transistor M1 of the pixel in the read scanning row turns off. With this operation, the voltage of the floating diffusion FD in the read scanning row is confirmed, and the confirmed voltage is amplified by the source follower operation to be read out to the vertical output line 108.

Thereafter, when the control signal VPD_ON turns to the low level at a time T15, the switches SW0 and SW1 of the voltage switch 13 turn off, and the supply of the potentials of the fixed voltage terminals V0 and V1 from the voltage supply unit 12 to the voltage supply lines 112 and 113 is interrupted.

Thereafter, at a time T16, the control signal PTX(1) in the shutter scanning row turns to the high level, and the transfer transistor M1 of the pixel in the shutter scanning row turns on. At this time, since the reset transistor M2 of the pixel in the shutter scanning row is also on, the charges of the photoelectric conversion unit PD are discharged to the power source voltage terminal VDD via the transfer transistor M1 and the reset transistor M2.

Thereafter, at a time T17, the control signal PTX(1) in the shutter scanning row turns to the low level, and the transfer transistor M1 of the pixel in the shutter scanning row turns off. At a time T18, the control signal PRES(1) in the shutter scanning row turns to the low level, and the reset transistor M2 of the pixel in the shutter scanning row turns off. With this operation, the shutter operation in the shutter scanning row ends.

Thereafter, at the time T19, the control signal PSEL(m) in the read scanning row turns to the low level, and the selection transistor M4 of the pixel in the read scanning row turns off. With this operation, the selection of the pixel in the read scanning row is cancelled, and the read operation in the read scanning row ends.

According to the present exemplary embodiment, as described above, the switches SW0 and SW1 of the voltage switch 13 are off (the control signal VPD_ON is at the low level) during the period in which the transfer transistor M1 in the shutter scanning row is on. A reason for this configuration will be described below.

In one embodiment, to completely eliminate the charges of the photoelectric conversion unit PD of the pixels 105 and 106 in the first region 10 by the shutter operation, the reset transistor M2 and the transfer transistor M1 in the shutter scanning row turn on at the same time. In particular, in a case where a saturated charge amount of the photoelectric conversion unit PD exceeds a saturated charge amount of the floating diffusion FD, the reset transistor M2 and the transfer transistor M1 are to turn on at the same time.

However, if the voltage supply from the voltage supply unit 12 to the pixels 110 and 111 in the second region 11 corresponding to the failure detecting pixel region is maintained in the above-described state, the fixed voltage terminals V1 and V0 and the power source voltage terminal VDD are short-circuited. Typically, the potential of the fixed voltage terminal V1 is approximately 1.6 V, and the power source voltage VDD is 3.3V. Therefore, since a short-circuit current flows, an adverse effect such as a situation where the potentials of the pixels 110 and 111 in the second region 11 are not correctly read occurs.

In view of the above, according to the present exemplary embodiment, the configuration is adopted in which the voltage switch 13 is provided between the voltage supply unit 12 and the pixels 110 and 111 in the second region 11. The driving is performed such that, when the transfer transistor M1 in the shutter scanning row turns on, the switches SW0 and SW1 of the voltage switch 13 turn off.

With this configuration, the short-circuit between the fixed voltage terminals V0 and V1 and the power source voltage terminal VDD is avoided at the time of the shutter scanning, and it is possible to increase a detection accuracy for the failure detection. That is, the short-circuit between the voltage terminals at the time of the shutter scanning, and it is attained that the detection accuracy for the failure detection is increased while the imaging and the failure detection are performed in real time.

It should be noted that, according to the present exemplary embodiment, the timing when the transfer transistor M1 in the shutter scanning row turns on is set to be later than the timing when the transfer transistor M1 in the read scanning row turns on. The present exemplary embodiment is not necessarily limited to this operation. That is, the timing when the transfer transistor M1 in the shutter scanning row turns on may be earlier than the timing when the transfer transistor M1 in the read scanning row turns on.

Top View of the Pixels

Figure 4A:
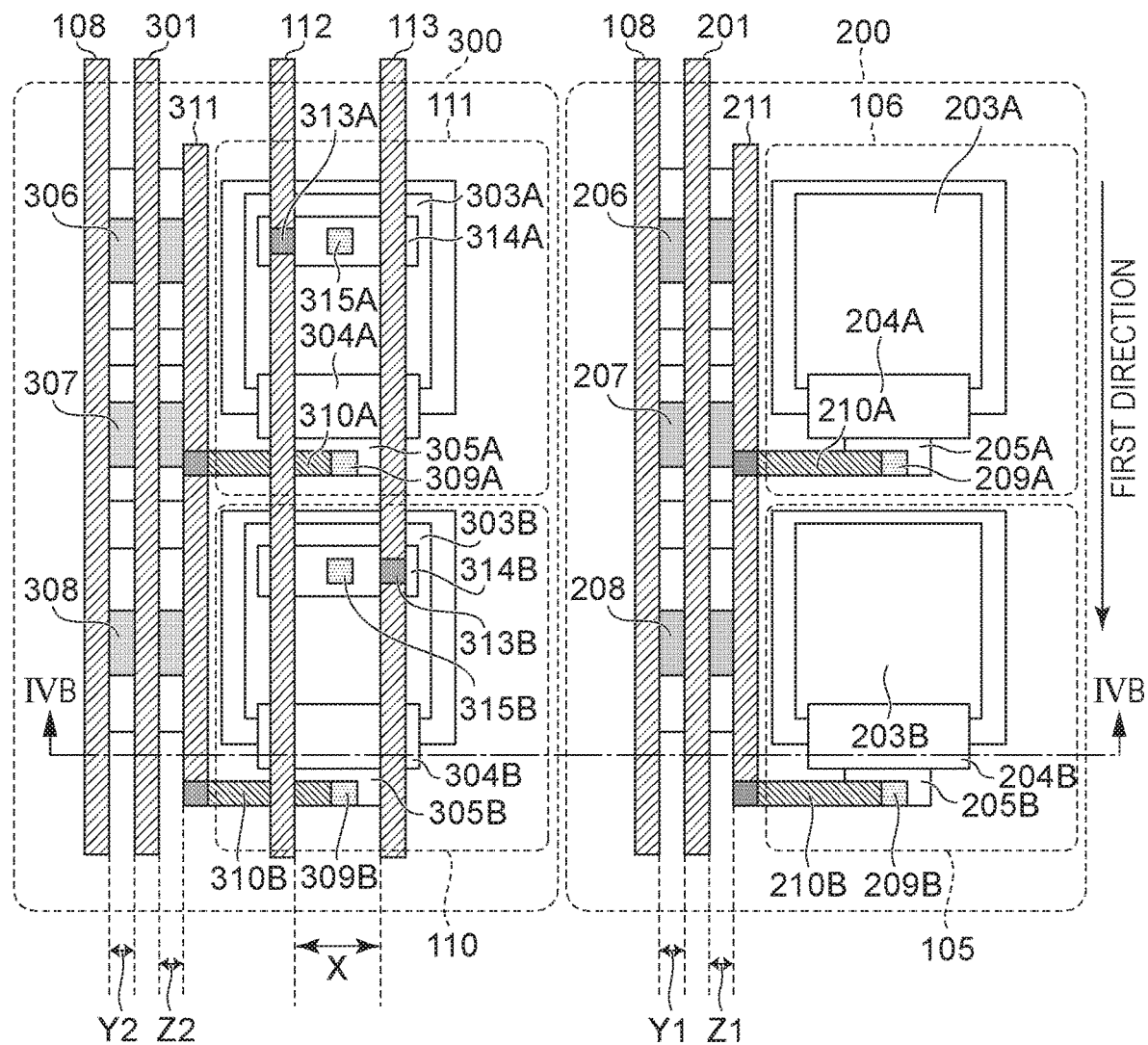
FIGS. 4A and 4B are a top view of the pixels and a cross sectional view of the pixels.

FIG. 4A is a top view of the pixels 105, 110, and 111. In FIG. 4A, a member having the same function as that of the member illustrated in FIG. 2 is also assigned with the same reference sign as that assigned in FIG. 2.

A pixel power source line 201 is a line that transmits the power source voltage VDD to the image obtaining pixel. The pixel cell 200 includes semiconductor regions 203A and 203B corresponding to part of the photoelectric conversion unit PD. The semiconductor regions 203A and 203B are charge accumulation units that accumulate the charges generated by the photoelectric conversion. Herein, a conductive type of the semiconductor regions 203A and 203B is set as an N type. In addition, the charges accumulated by the semiconductor regions 203A and 203B are set as electrons.

The pixel cell 200 further includes gates of 204A and 204B of the transfer transistor M1 and floating diffusion regions 205A and 205B corresponding to part of floating diffusion (hereinafter, which will be referred to as FD). The pixel cell 200 further includes a gate 206 of the selection transistor M4, a gate 207 of the amplification transistor M3, and a gate 208 of the reset transistor M2. The pixel cell 200 further includes FD connection contacts 209A and 209B (hereinafter, a contact is denoted as CNT), FD connection lines 210A and 210B, and an FD connection line 211. Hereinafter, a gate of the reset transistor is referred to as a reset gate, a gate of the transfer transistor is referred to as a transfer gate, a gate of the amplification transistor is referred to as an amplification gate, and a gate of the selection transistor is referred to as a selection gate.

The semiconductor region 203A is connected to the floating diffusion region 205A via the transfer gate 204A. The charges accumulated in the semiconductor region 203A are transferred to the floating diffusion region 205A via the transfer gate 204A. The floating diffusion region 205A is connected to the amplification gate 207 via the FD connection CNT 209A, the FD connection line 210A, and the FD connection line 211.

The semiconductor region 203B is connected to the floating diffusion region 205B via the transfer gate 204B. The charges accumulated in the semiconductor region 203B are transferred to the floating diffusion region 205B via the transfer gate 204B. The floating diffusion region 205B is connected to the amplification gate 207 via the FD connection CNT 209B, the FD connection line 210B, and the FD connection line 211.

The floating diffusion region 205A is connected to the reset transistor M2 via the FD connection CNT 209A, the FD connection line 210A, and the FD connection line 211. The floating diffusion region 205B is connected to the reset transistor M2 via the FD connection CNT 209B, the FD connection line 210B, and the FD connection line 211.

A pixel power source line 301 is a line that transmits the power source voltage VDD to the failure detecting pixel.

The pixel cell 300 for the failure detection includes semiconductor regions 303A and 303B corresponding to part of the photoelectric conversion unit PD that is shielded from the light. The pixel cell 300 also includes transfer gates 304A and 304B, floating diffusion areas 305A and 305B, a selection gate 306, an amplification gate 307, and a reset gate 308. The semiconductor region 303A is a first semiconductor region of a first conductivity type (N type). The floating diffusion area 305A is a second semiconductor region of the first conductivity type (N type).

The pixel cell 300 further includes FD connection CNTs 309A and 309B, FD connection lines 310A and 310B, an FD connection line 311, and the voltage supply lines 112 and 113. The pixel cell 300 further includes failure detecting VIAs 313A and 313B, failure detecting lines 314A and 314B, and failure detecting CNTs 315A and 315B.

The voltage supply line 112 and the voltage supply line 113 are arranged in an upper part of the photoelectric conversion unit PD of the pixel cell 300. In other words, in the plan view, the voltage supply line 112 and the photoelectric conversion unit PD are overlapped with each other, and the voltage supply line 113 and the photoelectric conversion unit PD are overlapped with each other.

The voltage supply line 112 is connected to the failure detecting line 314A via the failure detecting VIA 313A. Furthermore, the failure detecting line 314A is connected to the semiconductor region 303A via the failure detecting CNT 315A.

The potential applied to the semiconductor region 303A from the voltage supply line 112 is output to the floating diffusion area 305A via the transfer transistor M1.

The voltage supply line 113 is connected to the failure detecting line 314B via the failure detecting VIA 313B. Furthermore, the failure detecting line 314B is connected to the semiconductor region 303B via the failure detecting CNT 315B.

The potential applied to the semiconductor region 303B from the voltage supply line 113 is output to the floating diffusion area 305B via the transfer transistor M1.

The amplification transistor M3 outputs a signal in accordance with a potential of the amplification gate 307 to the vertical output line 108 via the selection transistor M4.

The floating diffusion area 305A is connected to the reset transistor M2 via the FD connection CNT 309A, the FD connection line 310A, and the FD connection line 311. The floating diffusion area 305B is connected to the reset transistor M2 via the FD connection CNT 309B, the FD connection line 310B, and the FD connection line 311.

The output of the pixel cell 300 for the failure detection turns to a signal level in accordance with a potential of the voltage supply line 112 or the voltage supply line 113.

Each of the vertical output line 108, the pixel power source line 201, and the pixel power source line 301 illustrated in FIG. 4A illustrates a partial line extending along a first direction of each of the vertical output line 108 and the pixel power source lines 201 and 301 in the pixel array 20 illustrated in FIG. 1. Hereinafter, to simplify the descriptions, unless particularly mentioned, each of the vertical output line 108, the pixel power source line 201, and the pixel power source line 301 is represented as the partial line extending in the first direction of each of the vertical output line 108, the pixel power source line 201 and the pixel power source line 301.

The pixel power source line 201 is a first line connected to the drain of the amplification transistor M3 of each of the first and second effective pixels 105. The vertical output line 108 is a second line connected to the source of the selection transistor M4 of each of the first and second effective pixels 105.

An interval between the pixel power source line 201 and the vertical output line 108 is indicated by a length Y1 in FIG. 4A. The length Y1 is a shortest length between an end part of the pixel power source line 201 and an end part of the vertical output line 108 facing the above-described end part.

The voltage supply line 112 is a third line that supplies a first potential to the pixel 111 corresponding to a first detection pixel. The voltage supply line 113 is a fourth line that supplies a second potential to the pixel 110 corresponding to a second detection pixel.

An interval between the voltage supply line 112 and the voltage supply line 113 is indicated by a length X in FIG. 4A. The length X is a shortest length between an end part of the voltage supply line 112 and an end part of the voltage supply line 113 facing the above-described end part.

Figure 4B:
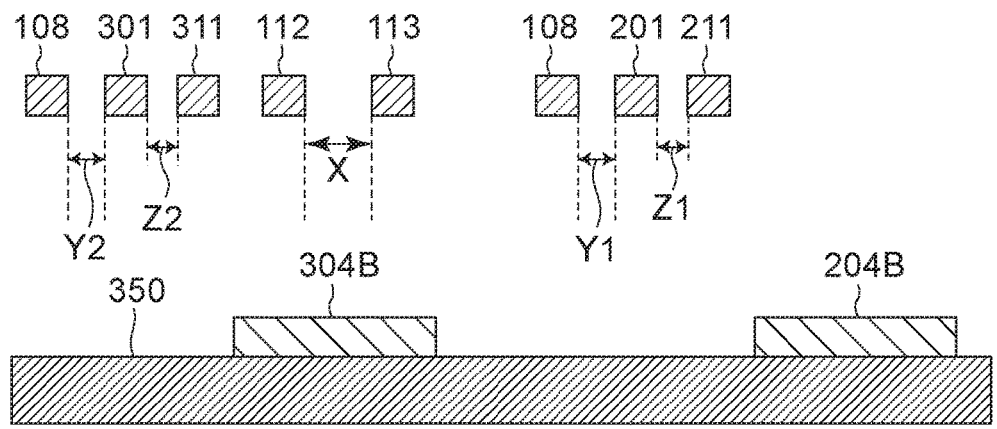

FIG. 4B is a cross sectional view at a position along a line IVB-IVB illustrated in FIG. 4A. The transfer gates 204B and 304B are provided in an upper part of a main surface 350 of a semiconductor substrate. The FD connection lines 211 and 311, the vertical output line 108, and the pixel power source lines 201 and 301 are provided at a height where the voltage supply lines 112 and 113 are provided.

When the voltage supply line 112 and the voltage supply line 113 are short-circuited, the voltages supplied to the semiconductor region 303A of the pixel 111 and the semiconductor region 303B of the pixel 110 become different from predetermined values. With this configuration, the values of the signals output from the pixel 110 and the pixel 111 become different from the predetermined value. As a result, it is determined that the imaging sensor is failing by a failure determination circuit which is not illustrated in the drawing. However, the failure is determined irrespective of a state in which the operation of the effective pixel is normal. Thus, when the voltage supply line 112 and the voltage supply line 113 are short-circuited, the normal failure determination with respect to the operation of the effective pixel is not performed.

According to the present exemplary embodiment, the length X is set to be longer than the length Y1. With this configuration, it is possible to decrease an occurrence probability of the short-circuit between the voltage supply line 112 and the voltage supply line 113. Thus, it is possible to improve an accuracy of the failure determination with respect to the effective pixel. In addition, a frequency at which the failure is determined is decreased, and it is possible to attain an improvement in a production yield of the imaging sensor.

A length in the plan view between an end part of the FD connection line 211 and the end part of the pixel power source line 201 facing the above-described end part is indicated as a length Z1. If the FD connection line 211 is arranged at a height between the pixel power source line 201 and the main surface of the semiconductor substrate, the length Z1 is a length in the plan view.

According to the present exemplary embodiment, the length X is set to be longer than the length Z1. With this configuration, as described above, it is possible to decrease the occurrence probability of the short-circuit between the voltage supply line 112 and the voltage supply line 113.

An interval between an end part of the pixel power source line 301 and the end part of the vertical output line 108 facing the above-described end part is indicated as a length Y2 in FIG. 4A. The length X may be set to be longer than the length Y2.

An interval between the end part of the pixel power source line 301 and an end part of the FD connection line 311 facing the above-described end part is indicated as a length Z2 in FIG. 4A. The length X may be set to be longer than the length Z2.

The length Y1 and the length Y2 may be the same length. In addition, the length Z1 and the length Z2 may be the same length.

An arrangement may also be adopted in which the pixel power source line 201 and the vertical output line 108 are swapped. In addition, an arrangement may be adopted in which the pixel power source line 301 and the vertical output line 108 are swapped.

A target of the comparison with the length X is set as the interval between the pixel power source line 201 and the vertical output line 108 or the interval between the pixel power source line 201 and the FD connection line 211. However, the configuration is not limited to this example, and the length of the mutually adjacent lines extending along the first direction can be set as the target of the comparison with the length X. In one embodiment, the interval between the mutual partial lines of the lines connected to the source or the drain of the transistor included in the pixel which extend along the first direction is set as the target of the comparison with the length X. The pixel power source line 201 is the line connected to the drains of the amplification transistor M3 and the reset transistor M2 in terms of the present exemplary embodiment. The vertical output line 108 is the line connected to the source of the selection transistor M4. The FD connection line 211 is the partial line of the line connected to one of the source and the drain of the transfer transistor M1.

In another embodiment, the target of the comparison with the length X is set as an interval between the mutual lines extending across a plurality of pixels. This is because the voltage supply line 112 and the voltage supply line 113 are lines arranged across the plurality of pixels. That is, similarly as in the voltage supply line 112 and the voltage supply line 113, the comparison is performed with the interval between the pixel power source line 201 and the vertical output line 108 arranged across the plurality of pixels. In addition, the comparison target with respect to the interval between the voltage supply line 112 and the voltage supply line 113 is set as the interval between the pixel power source line 201 and the vertical output line 108 instead of the interval between the pixel power source line 301 and the vertical output line 108. For example, to increase the speed for reading out the signals from the effective pixels in the plurality of rows, the plurality of vertical output lines 108 are provided with respect to the effective pixels in one column in some cases. In this manner, there is a tendency that miniaturization of the line extending in the first direction is demanded for the effective pixels. On the other hand, with regard to the voltage supply line 112 and the voltage supply line 113, when the miniaturization is advanced, a probability of the short-circuit because of a production defect or the like increases. Thus, the miniaturization is advanced with regard to the line related to the effective pixel in the line extending in the first direction, and progress of the miniaturization is suppressed with regard to the line related to the failure detecting pixel as compared with the line related to the effective pixel. With this configuration, it is possible to realize both the increase in the speed for reading out the signal of the effective pixel and the suppression of the decrease in the accuracy of the failure detection.

Furthermore, in a case where the voltage supply line 112 and the voltage supply line 113 are provided on the same line layer, the target of the comparison with the length X is set as the interval between the mutual lines arranged on the same line layer as the line layer of the voltage supply line 112 and the voltage supply line 113. In a case where the pixel power source line 201 and the vertical output line 108 are arranged on the line layer where the voltage supply line 112 and the voltage supply line 113 are provided, the interval between the pixel power source line 201 and the vertical output line 108 is set as the target of the comparison with the length X. This is because the lines arranged on the same line layer are formed in parallel at the time of the production of the imaging sensor. Therefore, the voltage supply line 112 and the voltage supply line 113 layer are formed in parallel, and the length X is set to be large with respect to the interval of the mutual lines extending along the first direction. With this configuration, it is possible to attain that the occurrence probability of the short-circuit between the voltage supply line 112 and the voltage supply line 113 can be decreased.

Example in which the Pixel is not Provided with the Selection Transistor M4

It should be noted that the selection transistor M4 is provided in each pixel according to the present exemplary embodiment. As another example, a mode can be adopted in which each pixel does not include the selection transistor M4. In this case, the vertical output line 108 corresponding to a second line is connected to the source of the amplification transistor M3. The pixel row where the signal is to be output can be selected by changing a potential of the power source voltage terminal VDD connected to the drain of the reset transistor M2. That is, with respect to a non-selection pixel row corresponding to a pixel row where the signal is not output, the potential of the power source voltage terminal VDD is set as a potential for the amplification transistor M3 to turn off (off potential). Then, the reset transistor M2 turns on, and the off potential is supplied to the floating diffusion FD. With this configuration, the amplification transistor M3 that has received the off potential enters an off state. On the other hand, with respect to a pixel row where the signal is output, the potential of the power source voltage terminal VDD is set as a potential for the amplification transistor M3 to turn on (on potential). Then, the reset transistor M2 turns on, and the on potential is supplied to the floating diffusion FD. With this configuration, the amplification transistor M3 that has received the on potential enters an on state and outputs the signal to the vertical output line 108.

Other Examples of the Failure Detecting VIA and the Failure Detecting CNT

According to the present exemplary embodiment, the pixel 111 is provided with the single failure detecting VIA 313A and the single failure detecting CNT 315A (the same also applies to the pixel 110).

Figure 9:
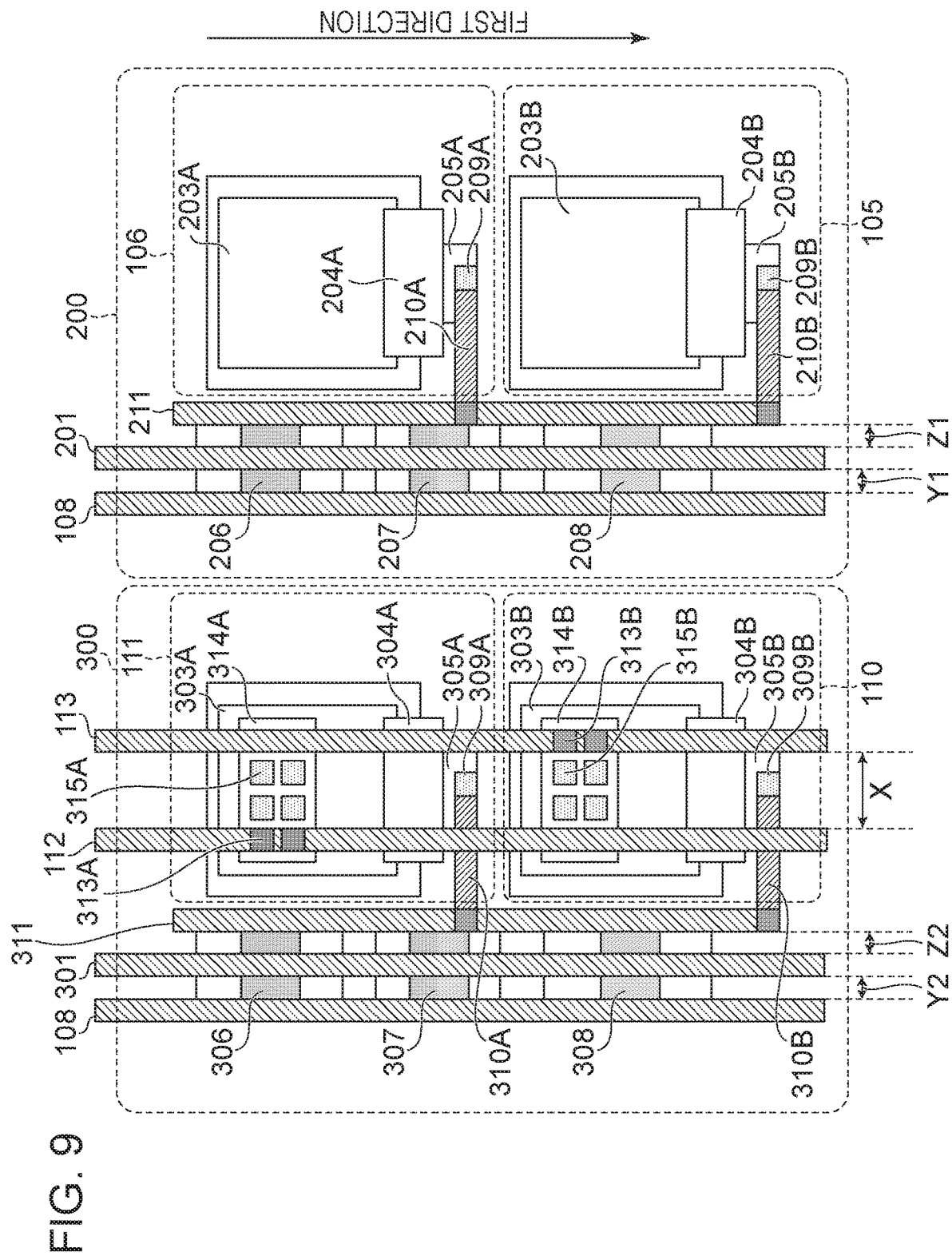
FIG. 9 is a top view of the pixels.

As another example, as illustrated in FIG. 9, a plurality of failure detecting VIAs 313A may be provided. That is, another failure detecting VIA 313A may be further provided at a height at which the single failure detecting VIA 313A is provided. In addition, a plurality of failure detecting CNTs 315A may be provided. That is, another failure detecting CNT 315A may be further provided at a height at which the single failure detecting CNT 315A is provided. With this configuration, it is possible to decrease a resistance between the voltage supply line 112 and the semiconductor region 303A (the same also applies to the pixel 110).

A case will be considered where one of the plurality of failure detecting VIAs 313A and one of the plurality of failure detecting CNTs 315A have defective continuity. In this case, since the other failure detecting VIA 313A and the other failure detecting CNT 315A are provided, it becomes possible for the voltage supply line 112 and the semiconductor region 303A to have continuity.

Top and Sectional Views of the Photoelectric Conversion Unit

The top surface of the pixel described with reference to FIG. 4A will be further described with reference to FIG. 5 while focusing on the photoelectric conversion unit.

Figure 5:
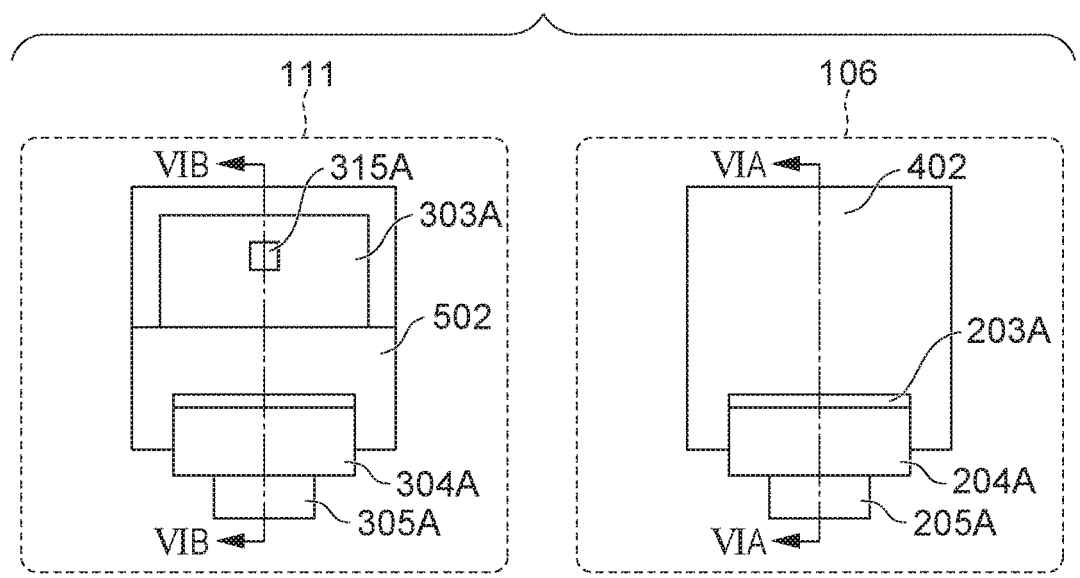
FIG. 5 is a top view of a photoelectric conversion unit and a transfer transistor.

FIG. 5 is a top view illustrating the image obtaining pixel 106, the photoelectric conversion unit PD of the failure detecting pixel 111, and the transfer transistor M1. In FIG. 5, a member having the same function as that of the member illustrated in FIG. 4A is also assigned with the same reference sign as that assigned in FIG. 4A.

First, the image obtaining pixel 106 will be described. In the plan view, the semiconductor region 203A where the charges are accumulated is overlapped with a P-type semiconductor region 402. Although it will be described below with reference to FIGS. 6A and 6B, the semiconductor region 402 functions as a surface protection layer for protecting the surface of the semiconductor region 203. Hereinafter, the semiconductor region 402 may be referred to as a surface protection layer.

Next, the failure detecting pixel 111 will be described. In the plan view, a P-type semiconductor region 502 is provided between a part connected to the failure detecting CNT 315A in the semiconductor region 303A and the transfer gate 304A.

Figure 6A:
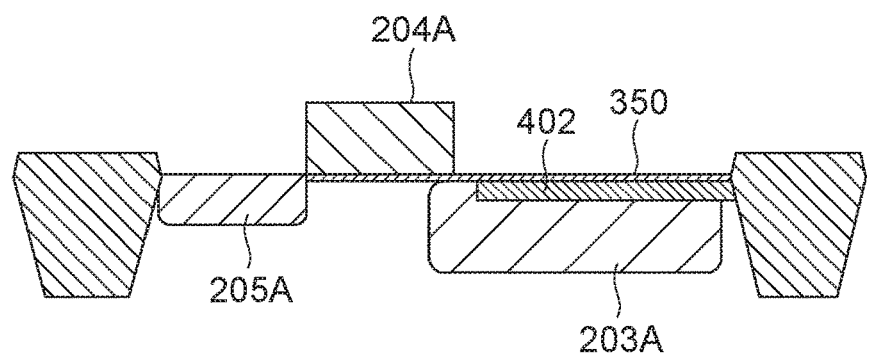
FIGS. 6A and 6B are cross sectional views of the photoelectric conversion unit and the transfer transistor.
Figure 6B:
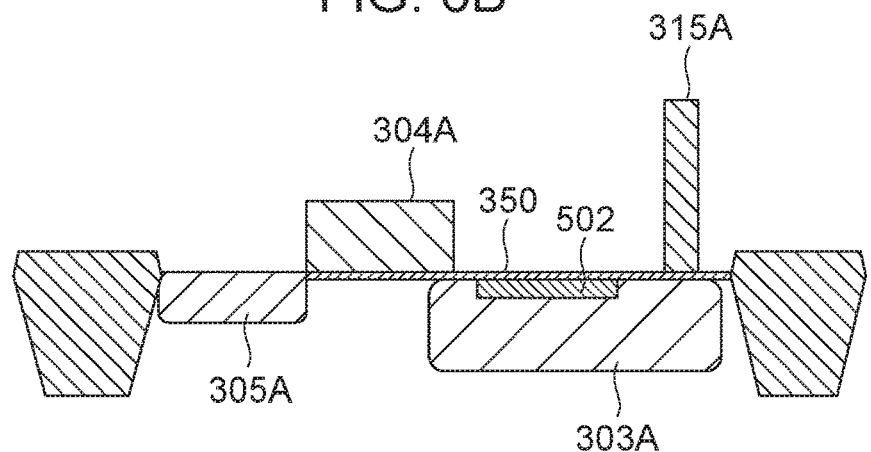

FIG. 6A is a cross sectional view of the pixel at a position through which a line VIA-VIA illustrated in FIG. 5 passes. FIG. 6B is a cross sectional view of the pixel at a position through which a line VIB-VIB illustrated in FIG. 5 passes.

First, the image obtaining pixel 106 (cross section corresponding to the line VIA-VIA) illustrated in FIG. 6A will be described. The semiconductor region 203A where the charges are accumulated is formed in a lower part of the P-type semiconductor region 402. With this configuration, the semiconductor region 402 functions as a surface protection layer for protecting the surface of the semiconductor region 203. The semiconductor region 402 is formed between the main surface 350 of the semiconductor substrate and the semiconductor region 203A.

Next, the failure detecting pixel 111 (cross section corresponding to the line VIB-VIB) illustrated in FIG. 6B will be described. The failure detecting CNT 315A is connected to a partial region of the semiconductor region 303A where the charges are accumulated. The semiconductor region 502 is not formed in the lower part of the failure detecting CNT 315A. In addition, the semiconductor region 502 is provided between the part to which the failure detecting CNT 315A is connected in the semiconductor region 303A and the transfer gate 304A. Moreover, with regard to the part where the semiconductor region 502 and the semiconductor region 303A are overlapped with each other in the plan view, the semiconductor region 303A is provided in the lower part of the semiconductor region 502. The semiconductor region 502 is formed between the main surface 350 of the semiconductor substrate and the semiconductor region 303A.

When the conductivity type of the semiconductor region 303A is the N type, the conductivity type of the semiconductor region 502 is the P type. For this reason, the semiconductor region 502 has a potential lower than that of the semiconductor region 303A. That is, the potential of the semiconductor region 502 is a potential between the potential at a time when the transfer gate 304A is off and the potential of the semiconductor region 303A. In a case where the semiconductor region 502 is not formed, an electric field corresponding to a potential difference between the transfer gate 304 and the semiconductor region 303A is applied to the transfer gate 304A. On the other hand, according to the present exemplary embodiment, since the semiconductor region 502 is provided, the potential applied to the transfer gate 304 is mitigated to an electric field corresponding to a potential difference between the transfer gate 304 and the semiconductor region 502. With this configuration, it is possible to establish a state in which the failure of the transfer transistor M1 of the failure detecting pixel 111 is unlikely to occur. That is, the pixel configuration according to the present exemplary embodiment can establish a state in which the failure of the pixel 111 is unlikely to occur. In addition, the imaging sensor according to the present exemplary embodiment can establish a state in which the production defect is unlikely to occur. With this configuration, the imaging sensor according to the present exemplary embodiment can also attain that it is possible to improve the yield of the production of the imaging sensor.

Second Exemplary Embodiment

The imaging sensor according to the present exemplary embodiment will be described while focusing on points different from the first exemplary embodiment.

Figure 7:
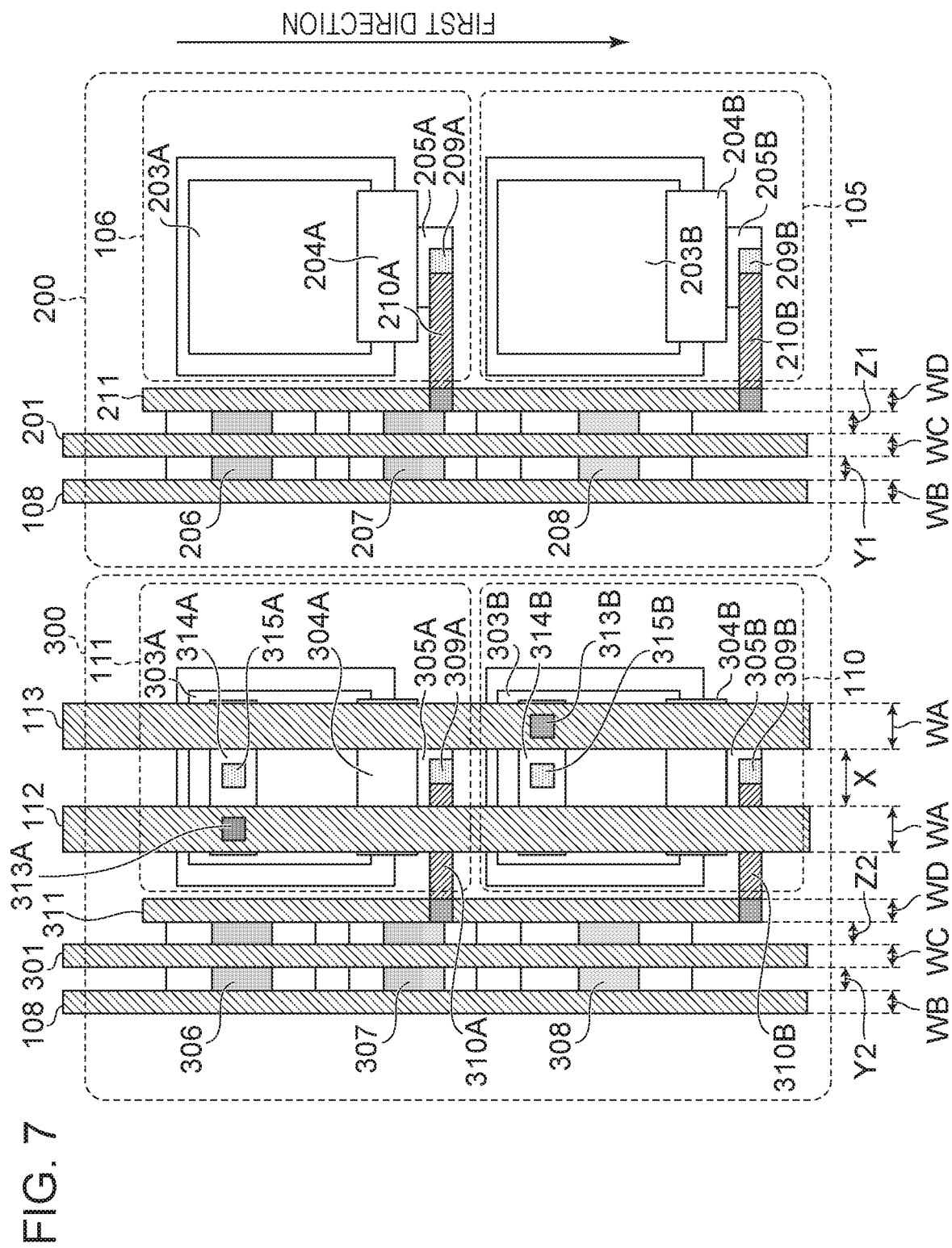
FIG. 7 is a top view of the photoelectric conversion unit and the transfer transistor.

FIG. 7 is a top view of the pixels 105, 110, and 111 of the imaging sensor according to the present exemplary embodiment. According to the present exemplary embodiment, a line width of the voltage supply line 112 and the voltage supply line 113 is set to be thicker than that of the other line extending along the first direction. The other line extending along the first direction is at least one of the pixel power source lines 201 and 301, the vertical output line 108, and the FD connection lines 211 and 311.

In FIG. 7, the line width of the voltage supply lines 112 and 113 is denoted as a width WA. A line width of the vertical output line 108 is denoted as a width WB, and a line width of the pixel power source lines 201 and 301 is denoted as a width WC. In addition, a line width of the FD connection lines 211 and 311 is denoted as a width WD.

According to the present exemplary embodiment, relationships of WA>WB, WA>WC, and WA>WD are established.

In general, as the line width is set to be thinner, a defect such as breaking is more likely to occur. In the imaging sensor according to the present exemplary embodiment, the line width of the voltage supply lines 112 and 113 is set to be thicker than that of the line extending along the first direction. With this configuration, it is possible to decrease the occurrence probability of the breaking of the voltage supply lines 112 and 113. In addition, since the line width of the voltage supply lines 112 and 113 is thickened, as compared with the case where the line width is set to have the same thickness as that of the line extending along the first direction; therefore, it is attainable that the resistance can be decreased.

Third Exemplary Embodiment

The imaging sensor according to the present exemplary embodiment will be described while focusing on points different from the first exemplary embodiment.

Figure 8:
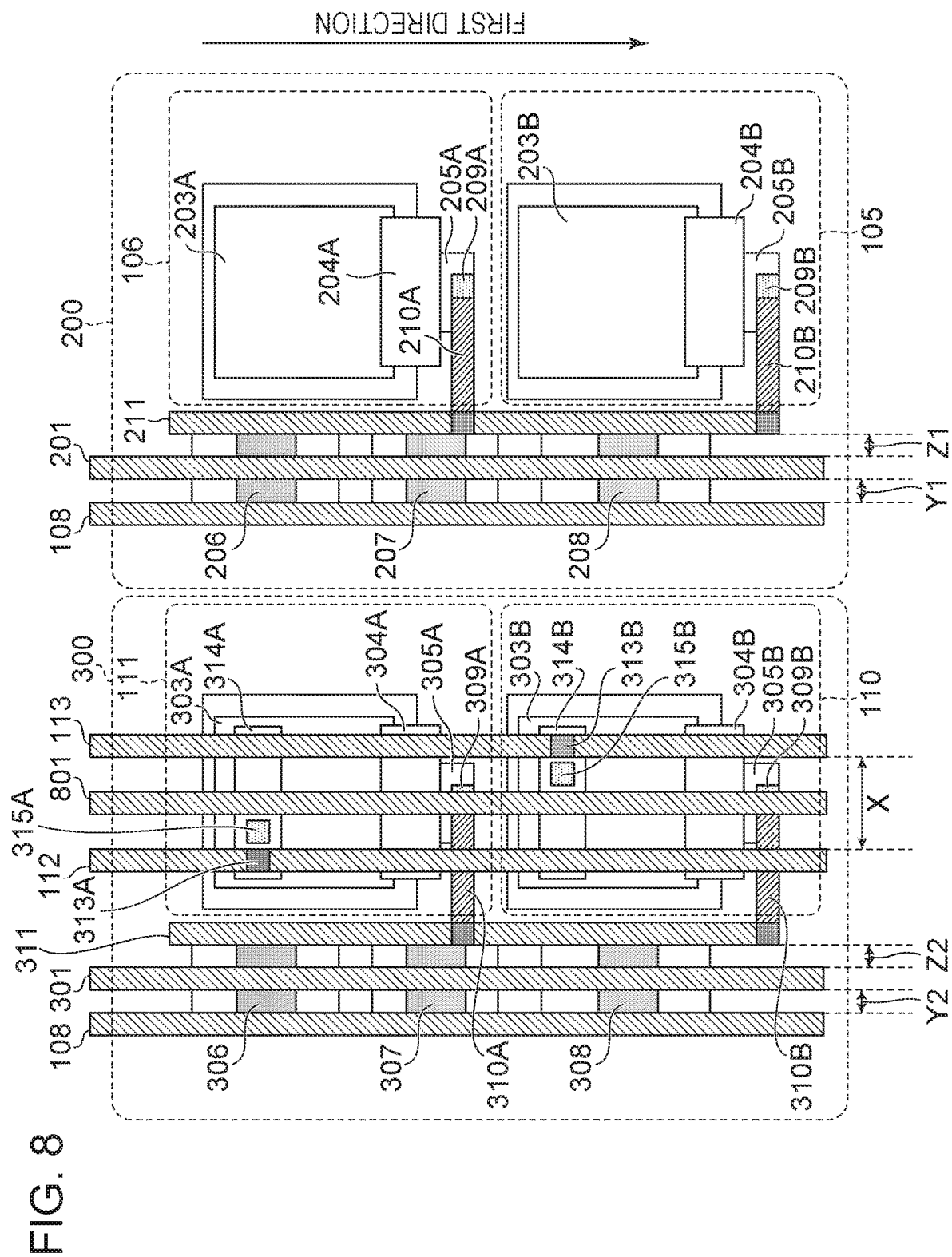
FIG. 8 is a cross sectional view of the photoelectric conversion unit and the transfer transistor.

FIG. 8 is a top view of the pixels 105, 110, and 111 of the imaging sensor according to the present exemplary embodiment.

The imaging sensor according to the present exemplary embodiment includes a shield line 801 between the voltage supply line 112 and the voltage supply line 113. As illustrated in FIG. 4B, the voltage supply line 112 and the voltage supply line 113 are arranged at the same height. The shield line 801 is also arranged at the height at which the voltage supply line 112 and the voltage supply line 113 are arranged.

The imaging sensor according to the present exemplary embodiment is provided with the shield line 801. With this configuration, in a case where the potential of the voltage supply line 112 is changed, it is possible to reduce a potential fluctuation of the voltage supply line 113 which is caused by capacitance coupling between the voltage supply line 113 and the voltage supply line 112. As a result, it is possible to establish a state in which an erroneous detection of the failure based on the potential fluctuation of the voltage supply line 113 is unlikely to occur.

Fourth Exemplary Embodiment

Figure 10:
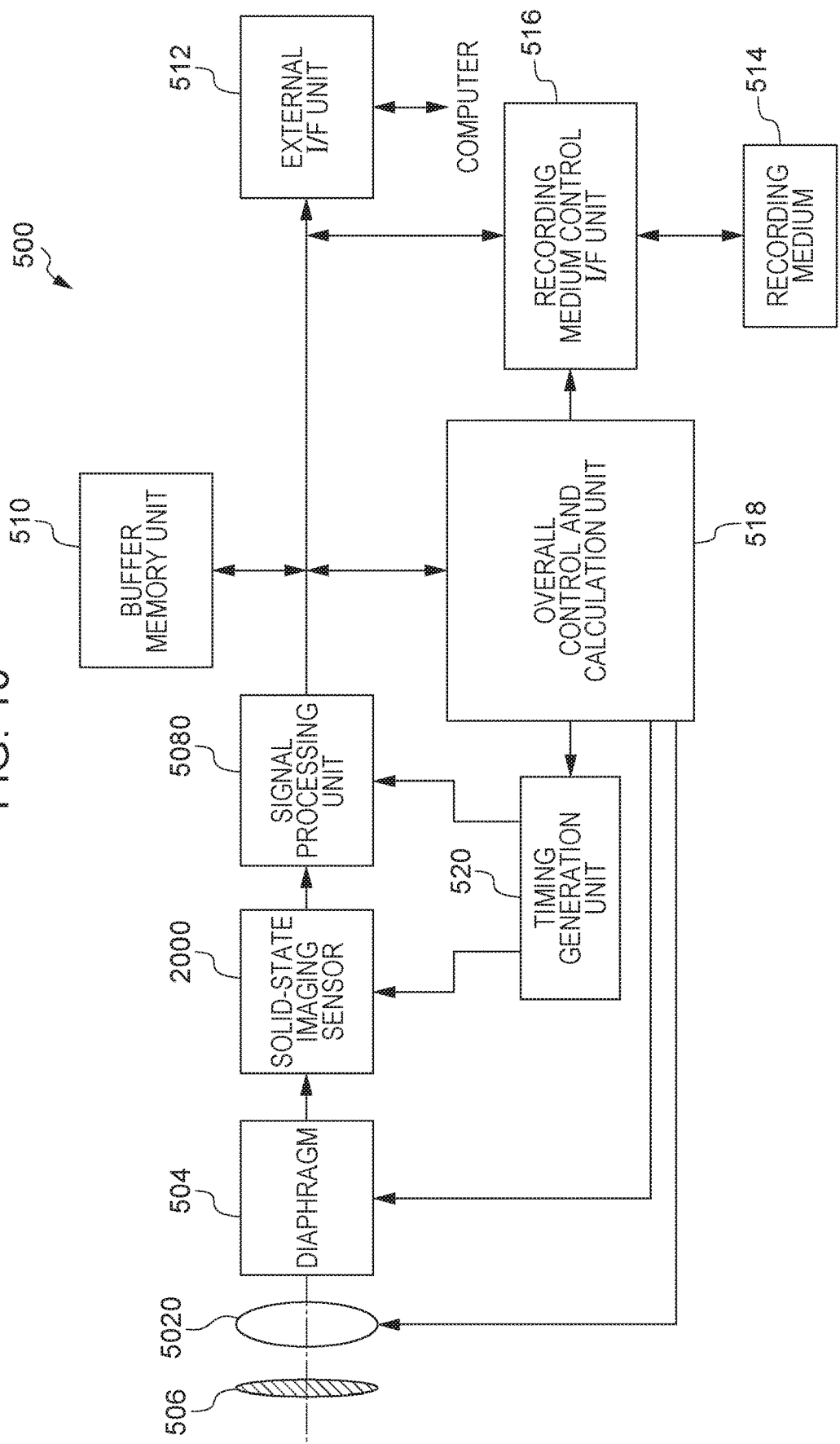
FIG. 10 is an overall view of an imaging system.

FIG. 10 is a block diagram illustrating a configuration of an imaging system 500 according to the present exemplary embodiment. The imaging system 500 according to the present exemplary embodiment includes an imaging sensor 2000 to which any one of the configurations of the imaging sensor according to the above-described respective exemplary embodiments. Specific examples of the imaging system 500 include a digital still camera, a digital camcorder, a monitoring camera, and the like. FIG. 10 illustrates a configuration example of the digital still camera to which the imaging sensor according to any one of the above-described respective exemplary embodiments is used as the imaging sensor 2000.

The imaging system 500 exemplified in FIG. 10 includes the imaging sensor 2000, a lens 5020 that focuses an optical image of the object on the imaging sensor 2000, a diaphragm 504 can vary the amount of light that has passed through the lens 5020, and a barrier 506 that protects the lens 5020. The lens 5020 and the diaphragm 504 are an optical system that focuses light on the imaging sensor 2000.

The imaging system 500 also includes a signal processing unit 5080 that processes an output signal output from the imaging sensor 2000. The signal processing unit 5080 performs signal processing operations for performing various corrections and compression with respect to the input signal when necessary and outputting the signal. The signal processing unit 5080 may be provided with a function for implementing the AD conversion processing on the output signal output from the imaging sensor 2000. In this case, the AD conversion circuit does not necessarily need to be provided inside the imaging sensor 2000.

The imaging system 500 further includes a buffer memory unit 510 configured to temporarily store image data and an external interface unit (external I/F unit) 512 used for communicating with an external computer or the like. The imaging system 500 further includes a recording medium 514 such as a semiconductor memory configured to perform recording or reading of imaging data and a recording medium control interface unit (recording medium control I/F unit) 516 used for performing recording or reading with respect to the recording medium 514. It should be noted that the recording medium 514 may be built in the imaging system 500 or may also be detachably attached.

The imaging system 500 further includes an overall control and calculation unit 518 configured to perform various calculations and also control the entirety of the digital still camera and a timing generation unit 520 configured to output various timing signals to the imaging sensor 2000 and the signal processing unit 5080. Herein, the timing signals and the like may be input from the outside, and it is sufficient when the imaging system 500 includes at least the imaging sensor 2000 and the signal processing unit 5080 configured to process the output signal output from the imaging sensor 2000. The overall control and calculation unit 518 and the timing generation unit 520 may also be configured so as to implement part or all of the control functions of the imaging sensor 2000.

The imaging sensor 2000 outputs an image signal to the signal processing unit 5080. The signal processing unit 5080 implements predetermined signal processing on the image signal output from the imaging sensor 2000 and outputs image data. The signal processing unit 5080 also generates an image by using the image signal.

When the imaging system is constituted by using the imaging sensor based on the imaging sensor according to the above-described respective exemplary embodiments, it is possible to realize the imaging system in which an image of a better quality can be obtained.

Fifth Exemplary Embodiment

An imaging system and a moving body according to the present exemplary embodiment will be described with reference to FIGS. 11A and 11B and FIG. 12.

Figure 11A:
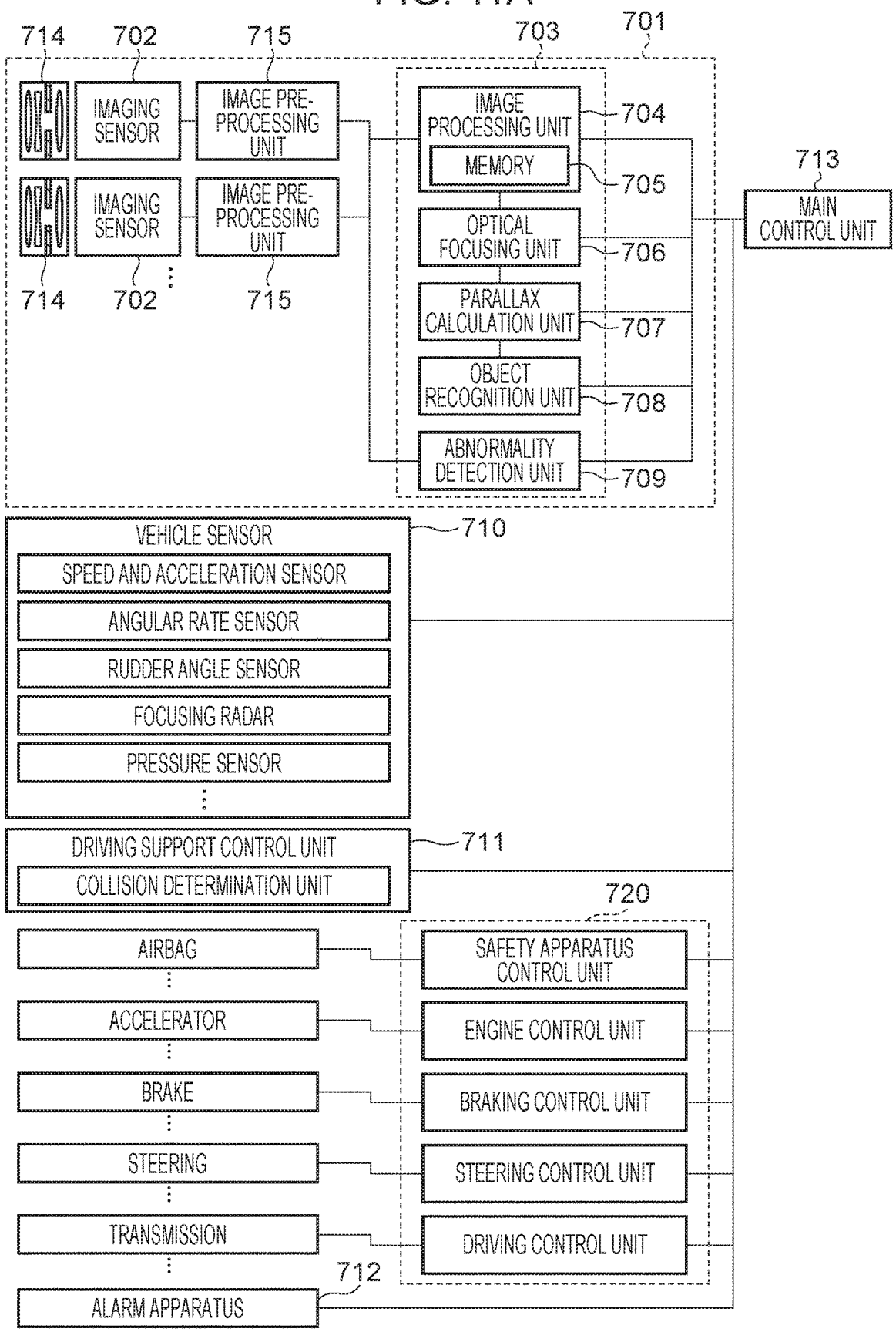

FIGS. 11A and 11B are schematic diagrams illustrating configuration examples of the imaging system and the moving body according to the present exemplary embodiment. FIG. 12 is a flow chart illustrating the operation of the imaging system according to the present exemplary embodiment.

According to the present exemplary embodiment, an example of the imaging system related to an on-vehicle camera is illustrated. FIGS. 11A and 11B illustrate examples of a vehicle system and an imaging system mounted to this vehicle system. An imaging system 701 includes an imaging sensor 702, an image pre-processing unit 715, an integrated circuit 703, and an optical system 714. The optical system 714 focuses an optical image of an object on the imaging sensor 702. The imaging sensor 702 converts the optical image of the object focused by the optical system 714 into an electric signal. The imaging sensor 702 is the imaging sensor according to any one of the first to fourth exemplary embodiments. The image pre-processing unit 715 performs predetermined signal processing on the signal output from the imaging sensor 702. A function of the image pre-processing unit 715 may be incorporated in the imaging sensor 702. At least two sets of the optical systems 714, the imaging sensors 702, and the image pre-processing units 715 are provided in the imaging system 701, and the output from the image pre-processing unit 715 of each of the sets is input to the integrated circuit 703.

The integrated circuit 703 is an integrated circuit for an imaging system use and includes an image processing unit 704 including a memory 705, an optical focusing unit 706, a parallax calculation unit 707, an object recognition unit 708, and an abnormality detection unit 709. The image processing unit 704 performs image processing such as development processing or defect correction on the output signal of the image pre-processing unit 715. The memory 705 stores a primary memory of the picked-up image and a defect position of the imaging pixel. The optical focusing unit 706 performs focusing of the object and ranging. The parallax calculation unit 707 calculates parallax (phase difference of parallax images) from plural pieces of image data obtained by the plurality of imaging sensors 702. The object recognition unit 708 recognizes an object such as a car, a road, a road sign, or a person. When an abnormality of the imaging sensor 702 is detected, the abnormality detection unit 709 notifies a main control unit 713 of the abnormality.

The integrated circuit 703 may be realized by dedicatedly designed hardware or a software module or may also be realized by a combination of these. In addition, the integrated circuit 703 may be realized by a field programmable gate array (FPGA), an application specific integrated circuit (ASIC), or the like or may also be realized by a combination of these.

The main control unit 713 governs and controls operations of the imaging system 701, a vehicle sensor 710, a control unit 720, and the like. It should be noted that a method (for example, CAN standards) may also be adopted with which the main control unit 713 is not provided, and the imaging system 701, the vehicle sensor 710, and the control unit 720 individually include communication interfaces and respectively transmit and receive control signals via communication networks.

The integrated circuit 703 includes a function of receiving the control signal from the main control unit 713 or transmitting the control signal or a setting value to the imaging sensor 702 by its own control unit. For example, the integrated circuit 703 transmits a setting for the voltage switch 13 in the imaging sensor 702 to perform pulse driving, a setting for switching the voltage switch 13 for every frame, and the like.

The imaging system 701 is connected to the vehicle sensor 710 and can detect its own vehicle travelling states such as a vehicle speed, a yaw rate, and a rudder angle, an environment outside its own vehicle, and states of other vehicles and obstacles. The vehicle sensor 710 is also a distance information obtaining unit configured to obtain distance information from a parallax image to an object. The imaging system 701 is connected to a driving support control unit 711 that performs various driving supports such as automated steering, automated cruising, and a collision prevention function. In particular, with regard to the collision prevention function, a collision with the other vehicles and the obstacles is estimated and the presence or absence of collision is determined on the basis of detection results of the imaging system 701 and the vehicle sensor 710. With this configuration, collision avoidance control and safety apparatus activation at the time of the collision are performed in a case where the collision is estimated.

The imaging system 701 is also connected to an alarm apparatus 712 that issues an alarm to a driver on the basis of the determination result of the collision determination unit. For example, in a case where a collision probability is high as the determination result of the collision determination unit, the main control unit 713 performs vehicle control for avoiding the collision or alleviating damages by applying brake, returning an accelerator, and suppressing an engine output, for example. The alarm apparatus 712 issues an alarm to a user by emitting an alarm such as sound, displaying alarm information on a screen of a display unit such as a car navigation system or a gauge panel, and supplying vibration to a seat belt or steering, for example.

According to the present exemplary embodiment, a surrounding of the vehicle such as, for example, a forward area or a backward area is imaged by the imaging system 701. FIG. 11B illustrates an arrangement example of the imaging system 701 in a case where the forward area of the vehicle is imaged by the imaging system 701.

The two imaging sensors 702 are arranged in a front part of a vehicle 700. Specifically, a center line with respect to forward and backward directions of the vehicle 700 or an external shape (for example, a vehicle width) is regarded as a symmetric axis, and the two imaging sensors 702 are arranged so as to have line symmetry with respect to the symmetric axis. In one embodiment, the above-described configuration is adopted when the distance information between the vehicle 700 and the object to be imaged is obtained and the collision probability is determined. In addition, the imaging sensors 702 are arranged at positions that do not disturb a sight of a driver when the driver visually checks a situation outside the vehicle 700 from a driver's seat. The alarm apparatus 712 is arranged at a position where the alarm apparatus easily comes into the sight of the driver.

Next, the failure detection operation of the imaging sensor 702 in the imaging system 701 will be described with reference to FIG. 12. The failure detection operation of the imaging sensor 702 is executed while following steps S810 to S880 illustrated in FIG. 12.

Step S810 is a step for performing a setting at the time of start-up of the imaging sensor 702. That is, the setting for the operation of the imaging sensor 702 is transmitted from the outside of the imaging system 701 (for example, the main control unit 713) or the inside of the imaging system 701, and the imaging operation of the imaging sensor 702 and the failure detection operation are started. The setting for the operation of the imaging sensor 702 includes a setting for controlling the voltage switch 13.

Thereafter, in step S820, the signals from the pixels 105 and 106 in the first region 10 corresponding to the image obtaining pixel region belonging to the scanning row are obtained. In step S830, the output values from the pixels 110 and 111 in the second region 11 belonging to the scanning row are obtained. It should be noted that step S820 and step S830 may also be reversed.

Thereafter, in step S840, whether or not output expected values of the pixels 110 and 111 and actual output values from the pixels 110 and 111 are matched with each other is performed on the basis of connection settings of the fixed voltage terminals V0 and V1 to the pixels 110 and 111.

As a result of the matching determination in step S840, in a case where the output expected values are matched with the actual output values, the processing step shifts to step S850, and it is determined that the imaging operation in the first region 10 is normally performed. Then the processing step shifts to step S860. In step S860, the pixel signal in the scanning row is transmitted to the memory 705 and primarily saved. Thereafter, the processing step returns to step S820, and the failure detection operation continues.

On the other hand, as a result of the matching determination in step S840, in a case where the output expected values are not matched with the actual output values, the processing step shifts to step S870. In step S870, it is determined that an abnormality occurs in the imaging operation in the first region 10, and an alarm is issued to the main control unit 713 or the alarm apparatus 712. The alarm apparatus 712 displays an effect that the abnormality is detected on the display unit. Thereafter, in step S880, the imaging sensor 702 stops, and the operation of the imaging system 701 ends.

It should be noted that the example in which the flow chart loops every row has been described according to the present exemplary embodiment, but the flow chart may loop every plural rows, or the failure detection operation may be performed every frame.

In addition, the control for avoiding the collision with the other vehicle has been described according to the present exemplary embodiment, but the technology can be applied to control for following the other vehicle to perform automated driving, control for the automated driving without drifting from a lane, or the like. Furthermore, the imaging system 701 can be applied to not only the vehicle such as an automobile but also a moving body (moving apparatus) such as, for example, a vessel, aircraft, or industrial robot. In addition, the imaging system can be widely applied to not only the moving body but also a device using object recognition such as an intelligent transport system (ITS).

Modified Examples

Not only the above-described exemplary embodiments but also various modifications can be made with regard to the disclosure.

For example, exemplary embodiments of the disclosure also include an example in which part of the configurations according to any one of the exemplary embodiments is added to the other exemplary embodiment and an example in which the configuration is replaced with part of the configuration according to the other exemplary embodiment.

In addition, according to the above-described exemplary embodiments, the case has been described for the explanation by assuming that the transistors of the pixels 105, 106, 110, and 111 are constituted by N-type transistors, but the transistors of the pixels 105, 106, 110, and 111 may also be constituted by P-type transistors. In this case, the signal levels of the respective driving signals in the above-described explanation are reversed.

Moreover, the circuit configuration of the pixel described thus far is not limited to the circuit configuration illustrated in FIG. 2, and alterations can be appropriately made. For example, the pixels 105, 106, 110, and 111 may also have a dual pixel structure in which two photoelectric conversion units are arranged with respect to a single micro lens.

The above-described exemplary embodiments are all merely examples of the specified configurations for carrying out the disclosure, and the technical scope of the disclosure is not be restrictively interpreted by these exemplifications. That is, the aspect of the embodiments can be carried out in various modes without departing from its technical concept or its main features. In addition, the disclosure can also be carried out by various combinations of the respective exemplary embodiments described thus far.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. An imaging sensor provided with a pixel array including a plurality of pixels arranged in a plurality of rows and a plurality of columns,
the plurality of pixels including a first pixel, a second pixel, and an effective pixel, and
each of the first pixel and the second pixel including a first semiconductor region of a first conductivity type, a second semiconductor region of the first conductivity type, a transfer gate connected to the first semiconductor region and the second semiconductor region, and an amplification transistor connected to the second semiconductor region,
the imaging sensor comprising:
a first line and a second line connected to the effective pixel;
a third line;
a fourth line;
a first contact configured to connect the first semiconductor region of the first pixel and the third line; and
a second contact configured to connect the first semiconductor region of the second pixel and the fourth line;
wherein each of the first line and the second line includes a partial line overlapping with the pixel array in a plan view, and the partial line of the first line and the partial line of the second line are adjacent to each other, and extend in parallel, wherein each of the third line and the fourth line includes a partial line overlapping with the pixel array in a plan view, and wherein an interval between the partial line of the third line and the partial line of the fourth line is longer than an interval between the partial line of the first line and the partial line of the second line in a plan view.

2. The imaging sensor according to claim 1,
wherein the effective pixel includes a photoelectric conversion unit and a plurality of transistors,
wherein each of the first line and the second line is connected to any one of the plurality of transistors, and
wherein the effective pixel includes an amplification transistor and a transfer transistor connected to the photoelectric conversion unit and the amplification transistor as the plurality of transistors.

3. The imaging sensor according to claim 1, further comprising
a plurality of effective pixels,
wherein the plurality of effective pixels include a first effective pixel and a second effective pixel,
wherein the second semiconductor region of the first effective pixel and the second semiconductor region of the second effective pixel are connected to each other by the partial line of the first line, and
wherein the second line is a line that supplies a power source voltage to the effective pixel or a line that transmits a signal output from the effective pixel.

4. The imaging sensor according to claim 1, further comprising
a plurality of effective pixels,
wherein the plurality of effective pixels include a first effective pixel and a second effective pixel,
wherein the second semiconductor region of the first effective pixel and the second semiconductor region of the second effective pixel are connected to each other by a connection line,
wherein the connection line includes a partial line extending in parallel with the partial line of the third line, and
wherein the interval between the partial line of the third line and the partial line of the fourth line is longer than an interval between the partial line of one of the first line and the second line and the partial line of the connection line in the plan view.

5. The imaging sensor according to claim 3,
wherein each of the first effective pixel and the second effective pixel further includes a selection transistor connected to the amplification transistor as the plurality of transistors,
wherein the first line is connected to the amplification transistor, and
wherein the second line is connected to the selection transistor.

6. The imaging sensor according to claim 1,
wherein the first line is a line that supplies a power source voltage to the first effective pixel and the second effective pixel, and
wherein the second line is a line where a signal is output from each of the first effective pixel and the second effective pixel.

7. The imaging sensor according to claim 1, further comprising a fifth line which extends in parallel with the partial line of the third line between the partial line of the third line and the partial line of the fourth line and to which a predetermined potential is supplied.

8. The imaging sensor according to claim 1,
wherein a width of the partial line of the third line is thicker than a width of the partial line of the first line and a width of the partial line of the second line, and
wherein a width of the partial line of the fourth line is thicker than the width of the partial line of the first line and the width of the partial line of the second line.

9. The imaging sensor according to claim 1, wherein the second contact is arranged at a same height as a height at which the first contact is arranged.

10. The imaging sensor according to claim 1, further comprising:
a first conductive line, a second conductive line, a first via connected to the first conductive line and the third line, and a second via connected to the second conductive line and the fourth line,
wherein the first semiconductor region of the first pixel and the third line are connected via the first contact, the first conductive line, and the first via, and
wherein the first semiconductor region of the second pixel and the fourth line are connected via the second contact, the second conductive line, and the second via.

11. The imaging sensor according to claim 1, further comprising:
a first conductive line, a second conductive line, a plurality of first vias connected to the first conductive line and the third line, and a plurality of second vias connected to the second conductive line and the fourth line,
wherein the first semiconductor region of the first pixel and the third line are connected via the first contact, the first conductive line, and the plurality of first vias, and
wherein the first semiconductor region of the second pixel and the fourth line are connected via the second contact, the second conductive line, and the plurality of second vias.

12. The imaging sensor according to claim 1, wherein a part of the third line overlaps with the transfer gate of the first pixel.

13. The imaging sensor according to claim 12, wherein a part of the fourth line overlaps with the transfer gate of the second pixel.

14. An imaging system comprising:
the imaging sensor according to claim 1; and
a signal processing unit configured to generate an image by processing a signal output by the imaging sensor.

15. A moving body comprising:
the imaging sensor according to claim 1;
a distance information obtaining unit configured to obtain distance information from a parallax image to an object based on a signal from the imaging sensor; and
a control unit configured to control the moving body based on the distance information.

16. An imaging sensor provided with a pixel array including a plurality of pixels arranged in a plurality of rows and a plurality of columns,
the plurality of pixels including a first pixel including a first semiconductor region of a first conductivity type, a second semiconductor region of the first conductivity type, a transfer unit configured to control a connection state between the first semiconductor region and the second semiconductor region, an amplification transistor connected to the second semiconductor region, and a transistor region including at least one transistor,
the imaging sensor comprising:

a first line; and a first contact configured to connect the first semiconductor region of the first pixel and the first line, wherein the first line includes a partial line overlapping with the transistor region of the first pixel in a plan view.

17. The imaging sensor according to claim 16, wherein the plurality of pixels further includes a second pixel including a first semiconductor region of a first conductivity type, a second semiconductor region of the first conductivity type, a transfer unit configured to control a connection state between the first semiconductor region and the second semiconductor region, an amplification transistor connected to the second semiconductor region, and a transistor region including at least one transistor, wherein the imaging sensor further comprises:

a second line; and a second contact configured to connect the first semiconductor region of the second pixel and the second line, and wherein the second line includes a partial line overlapping with the transistor region of the second pixel in a plan view.

18. The imaging sensor according to claim 16, wherein the one transistor includes a source region, a drain region, and a gate, and wherein the partial line of the first line overlaps with the gate in the first pixel in a plan view.

19. The imaging sensor according to claim 17, wherein the partial line of the second line overlaps with the gate in the second pixel in a plan view.

20. The imaging sensor according to claim 16, wherein the first pixel further includes a conductive line connected to the first contact, and a via connected to the first line.

21. The imaging sensor according to claim 20, wherein the first line extends along a first direction in the pixel array, and the conductive line extends in a second direction intersecting the first direction in a plan view.

22. The imaging sensor according to claim 16, wherein the part of the first line overlaps with the first semiconductor region of the first pixel.

23. The imaging sensor according to claim 16, wherein the first pixel and the second pixel are arranged in a different row.

24. The imaging sensor according to claim 16, further comprising a plurality of effective pixels, wherein the plurality of effective pixels include a first effective pixel and a second effective pixel, the first effective pixel and the first pixel are arranged in a same row, the second effective pixel and the second pixel are arranged in a same row, wherein each of the first effective pixel and the second effective pixel includes a first semiconductor region of a first conductivity type, a second semiconductor region of the first conductivity type, a transfer unit configured to control a connection state between the first semiconductor region and the second semiconductor region, an amplification transistor connected to the second semiconductor region, the transfer unit of the first pixel and the transfer unit of the first effective pixel are connected to a common control line, and the transfer unit of the second pixel and the transfer unit of the second effective pixel are connected to a common control line.

25. The imaging sensor according to claim 16, wherein the transfer unit is a transfer transistor having a transfer gate the transistor region includes the transfer transistor, and the gate overlapped with the partial line of the first line is the transfer gate in the first pixel.

26. The imaging sensor according to claim 25, wherein the gate overlapped with the partial line of the second line is the transfer gate in the second pixel.

27. An imaging system comprising:

the imaging sensor according to claim 16; and a signal processing unit configured to generate an image by processing a signal output by the imaging sensor.

28. A moving body comprising:

the imaging sensor according to claim 16;

a distance information obtaining unit configured to obtain distance information from a parallax image to an object based on a signal from the imaging sensor; and a control unit configured to control the moving body based on the distance information.

29. An imaging sensor provided with a pixel array including a plurality of pixels arranged in a plurality of rows and a plurality of columns, the plurality of pixels including a first pixel, a second pixel, and an effective pixel, and each of the first pixel and the second pixel including a first semiconductor region of a first conductivity type, a second semiconductor region of the first conductivity type, a transfer gate arranged between the first semiconductor region and the second semiconductor region, and an amplification transistor connected to the second semiconductor region, the imaging sensor comprising:

a first line and a second line connected to the effective pixel;

a third line that supplies a first potential to the first semiconductor region of the first pixel; and a fourth line that supplies a second potential to the first semiconductor region of the second pixel, wherein each of the first line and the second line includes a partial line extending along a first direction in the pixel array, and the partial line of the first line and the partial line of the second line are adjacent to each other, wherein each of the third line and the fourth line includes a partial line extending along the first direction in the pixel array, and wherein an interval between the partial line of the third line and the partial line of the fourth line is longer than an interval between the partial line of the first line and the partial line of the second line in a plan view.

30. The imaging sensor according to claim 29, wherein the effective pixel includes a photoelectric conversion unit and a plurality of transistors, wherein each of the first line and the second line is connected to any one of the plurality of transistors, and wherein the effective pixel includes an amplification transistor and a transfer transistor connected to the photoelectric conversion unit and the amplification transistor as the plurality of transistors.

31. The imaging sensor according to claim 29, further comprising a plurality of effective pixels, wherein the plurality of effective pixels include a first effective pixel and a second effective pixel, wherein the second semiconductor region of the first effective pixel and the second semiconductor region of the second effective pixel are connected to each other by the partial line of the first line, and wherein the second line is a line that supplies a power source voltage to the effective pixel or a line that transmits a signal output from the effective pixel.

32. The imaging sensor according to claim 29, further comprising
a plurality of effective pixels,
wherein the plurality of effective pixels include a first effective pixel and a second effective pixel,
wherein the second semiconductor region of the first effective pixel and the second semiconductor region of the second effective pixel are connected to each other by a connection line,
wherein the connection line includes a partial line extending along the first direction, and
wherein the interval between the partial line of the third line and the partial line of the fourth line is longer than an interval between the partial line of one of the first line and the second line and the partial line of the connection line in the plan view.

33. The imaging sensor according to claim 29,
wherein the first line is a line that supplies a power source voltage to the first effective pixel and the second effective pixel, and
wherein the second line is a line where a signal is output from each of the first effective pixel and the second effective pixel.

34. The imaging sensor according to claim 29, further comprising a fifth line which extends along the first direction between the partial line of the third line and the partial line of the fourth line and to which a predetermined potential is supplied.

35. The imaging sensor according to claim 29,
wherein a width of the partial line of the third line is thicker than a width of the partial line of the first line and a width of the partial line of the second line, and
wherein a width of the partial line of the fourth line is thicker than the width of the partial line of the first line and the width of the partial line of the second line.

36. The imaging sensor according to claim 29,
wherein the partial line of the third line and the first semiconductor region are connected to each other via a first contact, and
wherein the partial line of the third line and the first semiconductor region are further connected to each other via a second contact arranged at a same height as a height at which the first contact is arranged.

37. An imaging system comprising:
the imaging sensor according to claim 29; and
a signal processing unit configured to generate an image by processing a signal output by the imaging sensor.

38. A moving body comprising:
the imaging sensor according to claim 29;
a distance information obtaining unit configured to obtain distance information from a parallax image to an object based on a signal from the imaging sensor; and
a control unit configured to control the moving body on a basis of the distance information.

39. An imaging sensor provided with a pixel array including a plurality of pixels arranged in a plurality of rows and a plurality of columns,
the plurality of pixels including a first pixel and an effective pixel, and
each of the first pixel and the effective pixel including a first semiconductor region of a first conductivity type, a second semiconductor region of the first conductivity type, and a plurality of transistors, the plurality of transistors including a transfer transistor arranged between the first semiconductor region and the second semiconductor region, and an amplification transistor configured to output a signal based on a potential of the second semiconductor region,
the imaging sensor comprising:
a contact connected to the first semiconductor region of the first pixel; and
a first line that supplies a first potential to the first semiconductor region of the first pixel via the contact,
wherein a gate of one of the plurality of transistors of the first pixel and a gate of one of the plurality of transistors of the effective pixel are connected to a pixel control line commonly,
wherein a part of the first line overlaps with the first semiconductor region of the first pixel, in a plan view.

40. The imaging sensor according to claim 39, wherein a part of the first line overlaps with the gate of the first pixel.

41. The imaging sensor according to claim 39, wherein the first pixel further includes a conductive line connected to the contact, and a via connected to the first line.

42. The imaging sensor according to claim 41, wherein the first line extends along a first direction in the pixel array, and
the conductive line extends in a second direction intersecting the first direction in a plan view.

43. The imaging sensor according to claim 39, further comprising a second pixel and a second line, wherein
each of the first pixel and the second pixel includes the first semiconductor region, the second semiconductor region, and the plurality of transistors including the transfer transistor and the amplification transistor,
the second line supplies a second potential to the first semiconductor region of the second pixel,
a part of the first line overlaps with the first semiconductor region of the second pixel, and
a part of the second line overlaps with the first semiconductor region of the second pixel.

44. The imaging sensor according to claim 43, wherein a part of the second line overlaps with the first semiconductor region of the first pixel.

45. The imaging sensor according to claim 43, wherein the first pixel and the second pixel are arranged in a different row.

46. The imaging sensor according to claim 41, further comprising a second pixel and a second line, wherein
each of the first pixel and the second pixel includes the first semiconductor region, the second semiconductor region, and the plurality of transistors including the transfer transistor and the amplification transistor,
the second line supplies a second potential to the first semiconductor region of the second pixel,
a part of the first line overlaps with the first semiconductor region of the second pixel,
a part of the second line overlaps with the first semiconductor region of the second pixel, and
the contact is arranged in an area between the first line and the second line, in a plan view.

47. The imaging sensor according to claim 41, further comprising a second pixel and a second line, wherein
each of the first pixel and the second pixel includes the first semiconductor region, the second semiconductor region, and the plurality of transistors including the transfer transistor and the amplification transistor, the second line supplies a second potential to the first semiconductor region of the second pixel, a part of the first line overlaps with the first semiconductor region of the second pixel, a part of the second line overlaps with the first semiconductor region of the second pixel, the second pixel further includes a second contact connected to the first semiconductor region and a second conductive line, and a second via connected to the second line, and the via is arranged on a first side of the contact, in a plan view, and the second via is arranged on a second side opposite to the first side, in a plan view.

48. The imaging sensor according to claim 39 further comprising:

a third line and a fourth line connected to the effective pixel;

a second line that supplies a second potential to the first semiconductor region of the second pixel, wherein each of the third line and the fourth line includes a partial line extending along a first direction in the pixel array, and the partial line of the third line and the partial line of the fourth line are adjacent to each other, wherein each of the first line and the second line includes a partial line extending along the first direction in the pixel array, and wherein an interval between the partial line of the first line and the partial line of the second line is longer than an interval between the partial line of the third line and the partial line of the fourth line in a plan view.

* * * * *